United States Patent
Lauer et al.

(10) Patent No.: US 11,678,591 B2
(45) Date of Patent: Jun. 13, 2023

(54) VACUUM ENCAPSULATED JOSEPHSON JUNCTION

(71) Applicant: International Business Machines Corporation, Armonk, NY (US)

(72) Inventors: Isaac Lauer, Chappaqua, NY (US); Karthik Balakrishnan, Scarsdale, NY (US); Jeffrey Sleight, Ridgefield, CT (US); David James Frank, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 88 days.

(21) Appl. No.: 17/037,109

(22) Filed: Sep. 29, 2020

(65) Prior Publication Data

US 2022/0102612 A1 Mar. 31, 2022

(51) Int. Cl.

| | |
|---|---|
| *H01L 39/04* | (2006.01) |
| *H01L 39/02* | (2006.01) |
| *G06N 10/00* | (2022.01) |
| *H01L 39/24* | (2006.01) |
| *H01L 39/22* | (2006.01) |

(52) U.S. Cl.
CPC .......... *H01L 39/025* (2013.01); *G06N 10/00* (2019.01); *H01L 39/04* (2013.01); *H01L 39/223* (2013.01); *H01L 39/2493* (2013.01)

(58) Field of Classification Search
CPC . H01L 39/025; H01L 39/223; H01L 39/2493; H01L 39/04; H01L 39/045; G06N 10/00
See application file for complete search history.

(56) References Cited

U.S. PATENT DOCUMENTS

| | | | |
|---|---|---|---|
| 9,089,055 B2* | 7/2015 | Kitano | ................. B81B 7/0041 |
| 10,177,297 B2 | 1/2019 | Marcus et al. | |
| 10,403,809 B2 | 9/2019 | Krogstrup et al. | |
| 10,424,712 B2 | 9/2019 | Schoelkopf, III et al. | |
| 2015/0372217 A1* | 12/2015 | Schoelkopf, III | .. H01L 39/2406 505/413 |
| 2019/0207075 A1* | 7/2019 | Megrant | ................... H01F 6/04 |
| 2022/0102613 A1* | 3/2022 | Lauer | ..................... H01L 39/04 |

FOREIGN PATENT DOCUMENTS

DE 3128982 2/1983

OTHER PUBLICATIONS

Jurczak et al. "Silicon-on-Nothing (SON)—an Innovative Process for Advanced CMOS," IEEE Transactions on Electron Devices, vol. 47, Issue 11, Nov. 2000, 9 pages.

(Continued)

*Primary Examiner* — Matthew L Reames
(74) *Attorney, Agent, or Firm* — Erik Johnson

(57) ABSTRACT

Devices, systems, methods, and/or computer-implemented methods that can facilitate a qubit device comprising a vacuum encapsulated Josephson junction are provided. According to an embodiment, a device can comprise a substrate having an encapsulated vacuum cavity provided on the substrate. The device can further comprise one or more superconducting components of a superconducting circuit provided inside the encapsulated vacuum cavity.

20 Claims, 17 Drawing Sheets

(56) References Cited

OTHER PUBLICATIONS

Calusine et al., "Analysis and mitigation of interface losses in trenched superconducting coplanar waveguide resonators," Applied Physics Letters 112, Feb. 2018, 6 pages.
Gambetta et al., "Investigating Surface Loss Effects in Superconducting Transmon Qubits," IEEE Transactions on Applied Superconductivity, vol. 27, Issue 1, Jan. 2017, 5 pages.
Cord et al., "Robust shadow-mask evaporation via lithographically controlled undercut," J. Vac. Sci. Technol. B 24(6), 2006, 5 pages.
Wang et al., "Wafer-Level Vacuum Sealing by Transfer Bonding of Silicon Caps for Small Footprint and Ultra-Thin MEMS Packages," Journal of Microelectromechanical Systems, vol. 28, Issue 3, 2019, 12 pages.
Broom et al., "Encapsulated Josephson Devices," IP.com No. IPCOM000085723D, May 1, 1976, 2 pages.
Dolan, "Offset masks for lift-off photoprocessing," Applied Physics Letters 31, 337, http://dx.doi.org/10.1063/1.89690, Jun. 21, 1977, 4 pages.

\* cited by examiner

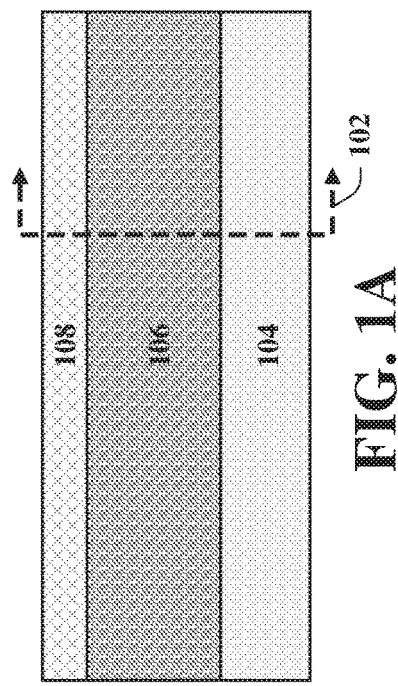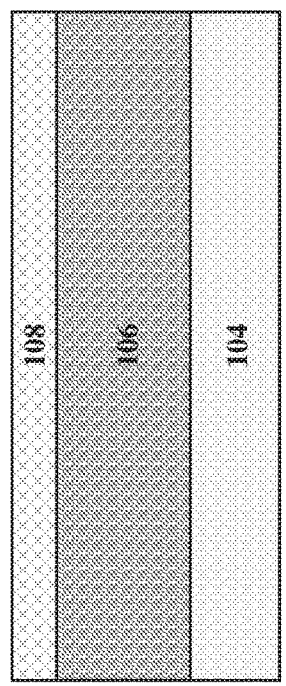

 200
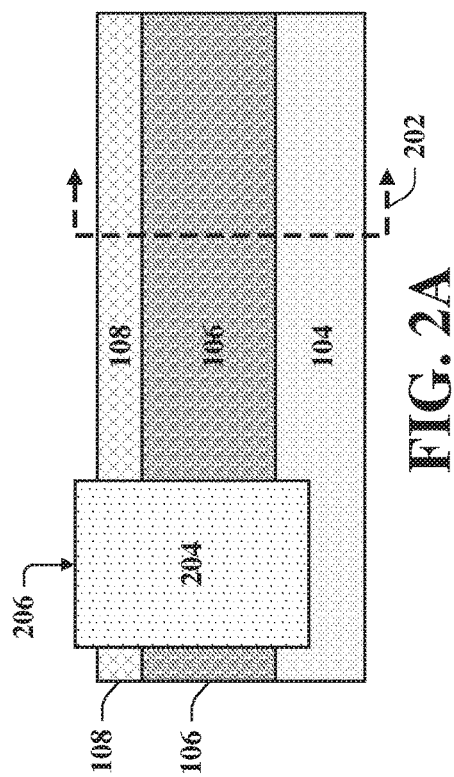
FIG. 2A
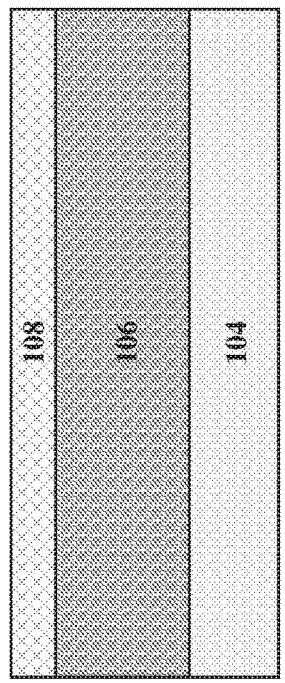
FIG. 2B

VACUUM ENCAPSULATED JOSEPHSON JUNCTION

BACKGROUND

The subject disclosure relates to qubit devices and a method for forming the same. More specifically, the subject disclosure relates to a qubit device comprising a vacuum encapsulated Josephson junction and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, and/or computer program products that facilitate a qubit device comprising a vacuum encapsulated Josephson junction are described.

According to an embodiment, a device can comprise a substrate having an encapsulated vacuum cavity provided on the substrate. The device can further comprise one or more superconducting components of a superconducting circuit provided inside the encapsulated vacuum cavity.

According to an embodiment, a method can comprise forming one or more superconducting components of a superconducting circuit inside a vacuum cavity provided on a substrate. The method can further comprise enclosing the vacuum cavity based on the forming to encapsulate the one or more superconducting components inside the vacuum cavity.

According to an embodiment, a device can comprise a substrate having an encapsulated vacuum cavity provided on the substrate. The device can further comprise one or more superconducting components comprising one or more epitaxial films provided inside the encapsulated vacuum cavity.

DESCRIPTION OF THE DRAWINGS

FIGS. 1A and 1B illustrate cross-sectional side views of an example, non-limiting device that can facilitate a qubit device comprising a vacuum encapsulated Josephson junction in accordance with one or more embodiments described herein.

FIGS. 2A and 2B illustrate cross-sectional side views of the example, non-limiting device of FIGS. 1A and 1B after forming an electrode on the device of FIGS. 1A and 1B in accordance with one or more embodiments described herein.

DETAILED DESCRIPTION

Figure 3A:
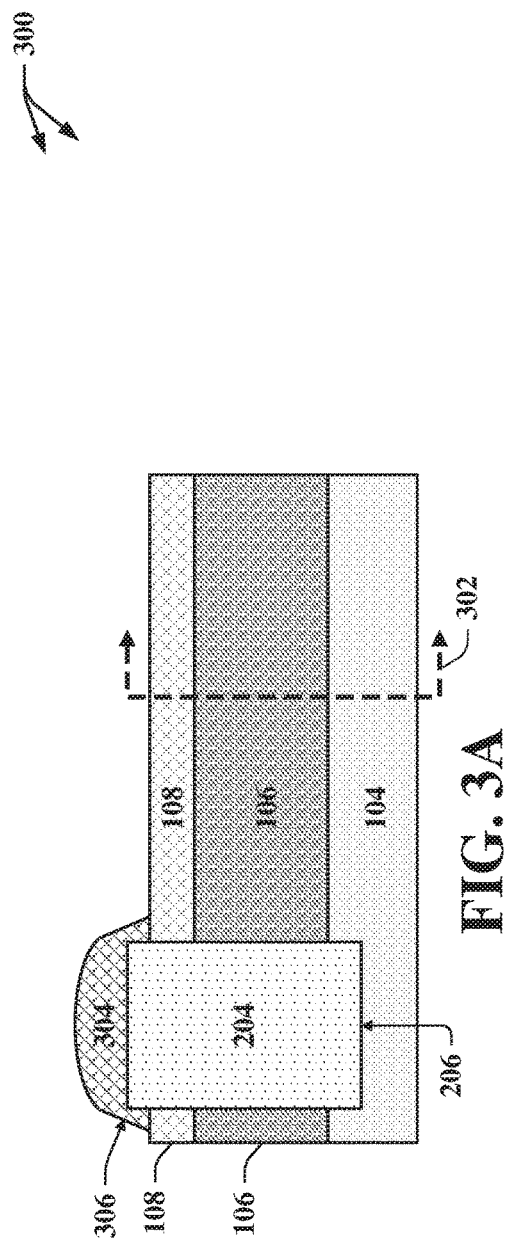
FIGS. 3A and 3B illustrate cross-sectional side views of the example, non-limiting device of FIGS. 2A and 2B after forming a hardmask on the electrodes formed on the device of FIGS. 2A and 2B in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments of the subject disclosure are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

The fidelity of quantum computers is affected by the loss occurring in the materials used to fabricate the components that are used to build such quantum computers. For example, transmon qubit shunt capacitors, resonators, and integrated filters are typically formed by patterning superconducting regions on a silicon (Si) substrate. Loss in these components can reduce the fidelity of the overall system (e.g., a quantum computer, quantum computing chip, etc.). For the design of these components, it is desirable for the electric field to be in regions of lowest dielectric loss, or loss tangent. The relative amount of the electric field in different materials is referred to as the participation ratio. Amorphous materials have relatively high loss tangents compared to crystalline materials, and vacuum has no loss tangent.

An important parameter setting the frequency of transmon qubits is the critical current of the Josephson junction. Exposing the Josephson junction to atmosphere at room temperature, as well as subsequent processing, results in structural change to the junction (e.g., via oxidation formed on the junction that creates lossy amorphous material), thus variation in critical current, and thus changes in qubit frequency. Fine control of qubit frequency is required to yield multiqubit chips, therefore it is desirable for qubit frequency to be stable.

FIGS. 1A-9B illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1A-9B can be implemented to fabricate device 900 depicted in FIGS. 9A and 9B. Device 900 can comprise a semiconducting and superconducting device that can comprise and/or be implemented as a quantum device in a quantum computing device. For example, device 900 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

As described below with reference to FIGS. 1A-9B, fabrication of device 900 can comprise a multi-step sequence of, for example, photolithographic and/or chemical processing steps that facilitate gradual creation of electronic-based systems, devices, components, and/or circuits in a semiconducting and superconducting device (e.g., an integrated circuit). For instance, device 900 can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., chemical vapor etch (CVE), reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), epitaxial deposition, chemical-mechanical planarization (CMP), backgrinding techniques, and/or another technique for fabricating an integrated circuit.

As referenced herein, "epitaxy" can describe a crystal growth process that can be employed to grow a new layer that is well oriented to a template (e.g., well oriented with respect to a substrate such as, for example, substrate 104 described below). Additionally, or alternatively, as referenced herein, "epitaxy" can describe a gas-phase epitaxy performed in a vacuum chamber at elevated temperature such as, for instance, low pressure chemical vapor deposition (LPCVD) or rapid thermal chemical vapor deposition (RTCVD), with precursor gases such as, for example, silane ($SiH_4$), dichlorosilane ($H_2SiCl_2$), germane ($GeH_4$), and/or another gas. As referenced herein, "chemical vapor etch (CVE)" can describe a gas phase removal of a material performed in a vacuum chamber at elevated temperature in a reactive ambient. Additionally, or alternatively, as referenced herein, "chemical vapor etch (CVE)" can describe a gas phase removal of a material performed using hydrogen chloride (HCl) as the etch gas, which removes silicon-germanium (SiGe) at a much higher rate than silicon (Si).

As described below with reference to FIGS. 1A-9B, device 900 can be fabricated using various materials. For example, device 900 can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

FIG. 1A illustrates a cross-sectional side view of an example, non-limiting device 100 that can facilitate a qubit device comprising a vacuum encapsulated Josephson junction in accordance with one or more embodiments described herein. FIG. 1B illustrates a cross-sectional side view of device 100 as viewed along a plane defined by line 102.

Device 100 can comprise a substrate 104. Substrate 104 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 104 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. In the example embodiment depicted in FIGS. 1A and 1B, substrate 104 can comprise a single crystal silicon (Si) substrate. Substrate 104 can comprise a thickness (e.g., height) ranging from approximately 50 micrometers (μm) to approximately 1 millimeter (mm). In some embodiments, substrate 104 can comprise a thickness (e.g., height) of 725 μm.

Device 100 can further comprise a removable layer 106 formed (e.g., grown) on substrate 104 as illustrated in FIGS. 1A and 1B. Removable layer 106 can comprise an epitaxial film that can be epitaxially grown on substrate 104 (e.g., via epitaxial deposition, LPCVD, RTCVD, etc.). In the example embodiment depicted in FIGS. 1A and 1B, removable layer 106 can comprise an epitaxial semiconductor film that can be epitaxially grown on substrate 104. For instance, removable layer 106 can comprise a compound epitaxial semiconductor film such as, for example, silicon-germanium (SiGe) that can be epitaxially grown on substrate 104. Removable layer 106 can comprise an epitaxial film comprising a certain composition of silicon-germanium (SiGe). For example, removable layer 106 can comprise an epitaxial film comprising a certain composition of silicon-germanium (SiGe) that can be determined using the equation: $Si_{(1-x)}Ge_x$, where x denotes the germanium (Ge) fraction that can be adjusted to achieve a desired composition of silicon-germanium (SiGe). Removable layer 106 can comprise a thickness (e.g., height) ranging from approximately 100 nanometers (nm) to approximately to 2 μm.

Device 100 can further comprise a cap layer 108 formed (e.g., grown) on removable layer 106 as illustrated in FIGS. 1A and 1B. Cap layer 108 can comprise an epitaxial film that can be epitaxially grown on removable layer 106 (e.g., via epitaxial deposition, LPCVD, RTCVD, etc.). Cap layer 108 can comprise the same material as that of substrate 104 (e.g., silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, silicon/silicon-germanium (Si/SiGe), silicon/silicon carbide (Si/SiC), silicon-on-insulators (SOIs), silicon germanium-on-insulators (SGOIs), etc.). In the example embodiment depicted in FIGS. 1A and 1B, cap layer 108 can be formed using, for instance, silicon (Si) and/or another material. This example of material is not intended to be limiting. From this disclosure those of ordinary skill in the art will be able to conceive of many other materials suitable for forming cap layer 108 and the same are contemplated within the scope of the illustrative embodiments. In the example embodiment depicted in FIGS. 1A and 1B, cap layer 108 can comprise a single crystal silicon (Si) material. Cap layer 108 can comprise a thickness (e.g., height) ranging from approximately 10 nm to approximately 500 nm.

Materials for removable layer 106 described above can be selected based on the composition of substrate 104 and/or cap layer 108, to provide crystal quality above a particular quality threshold. For example, removable layer 106 can be formed using a certain composition of silicon-germanium (SiGe) to match the crystal lattice of substrate 104 and/or cap layer 108. In one embodiment, removable layer 106 can comprise a gradual change in composition from the interface with substrate 104 to the interface with cap layer 108 to avoid creating crystal defects (e.g. dislocations) in removable layer 106. In one embodiment, the gradual change in composition can be a linear change. These examples of materials are not intended to be limiting. From this disclosure those of ordinary skill in the art will be able to conceive of many other materials suitable for forming removable layer 106 and the same are contemplated within the scope of the illustrative embodiments.

Removable layer 106 and/or cap layer 108 described above can comprise epitaxial films that can be grown on substrate 104 using an epitaxial film growth process performed in an epitaxial growth furnace (e.g., via epitaxial deposition, LPCVD, RTCVD, etc.). For example, removable layer 106 and/or cap layer 108 can be grown on substrate 104 together in situ during the same fabrication phase (e.g., in situ epitaxial film growth performed in an epitaxial growth furnace via, for instance, LPCVD, RTCVD, etc.).

Utilizing such an in situ epitaxial film growth process to grow removable layer 106 and/or cap layer 108 on substrate 104 in such a manner can facilitate desirable crystallinity of each layer (film), as well as prevent oxidation and/or defects at the interface between removable layer 106 and cap layer 108 and/or at the interface between substrate 104 and removable layer 106. Utilizing such an in situ epitaxial film growth process to grow removable layer 106 and/or cap layer 108 on substrate 104 in such a manner can further facilitate repeatable fabrication of each of such layers to a desirable dimension (e.g., height, thickness, etc.). Such repeatable fabrication of each of such layers to a desirable dimension (e.g., height, thickness, etc.) can facilitate: improved consistency of the desirable dimension in a plurality of qubit devices (e.g., a plurality of devices 900) fabricated using such an in situ epitaxial film growth process; and/or improved coherence time, improved performance, and/or improved lifespan of such a qubit device fabricated using such an in situ epitaxial film growth process.

FIG. 2A illustrates a cross-sectional side view of an example, non-limiting device 200 that can facilitate a qubit device comprising a vacuum encapsulated Josephson junction in accordance with one or more embodiments described herein. Additionally, or alternatively, FIG. 2A illustrates a cross-sectional side view of the example, non-limiting device 100 of FIGS. 1A and 1B after forming an electrode on device 100 in accordance with one or more embodiments described herein. FIG. 2B illustrates a cross-sectional side view of device 200 as viewed along a plane defined by line 202. Repetitive description of like elements and/or processes employed in other embodiments described herein is omitted for sake of brevity.

Device 200 can comprise an example, non-limiting alternative embodiment of device 100 after depositing electrode material 204 on device 100 to form electrodes 206, where only one electrode 206 is depicted in FIG. 2A for clarity. In some embodiments, electrode material 204 can comprise a superconducting material such as, for instance, niobium (Nb) and/or another superconducting material. In these embodiments, electrodes 206 can comprise superconducting electrodes.

Figure 4A:
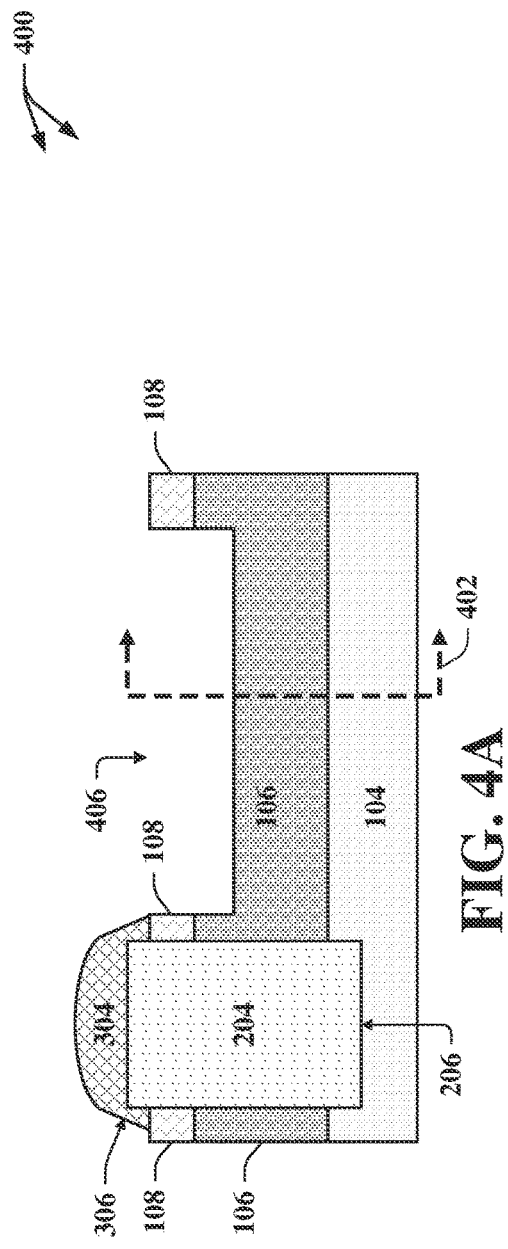
FIGS. 4A, 4B, and 4C illustrate cross-sectional side and top views of the example, non-limiting device of FIGS. 3A and 3B after removing portions of one or more material layers from the device of FIGS. 3A and 3B in accordance with one or more embodiments described herein.
Figure 4B:
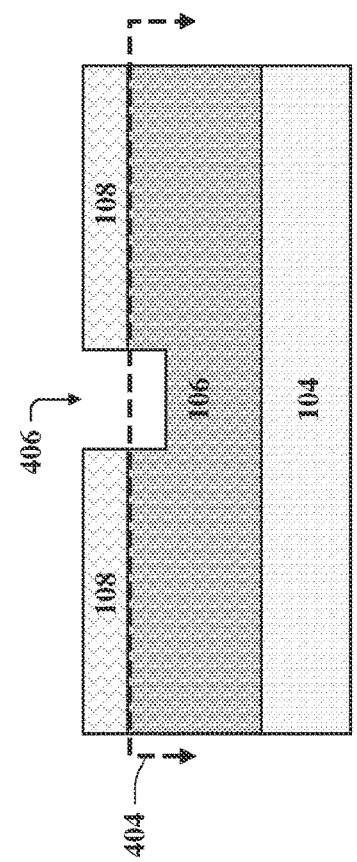
Figure 4C:
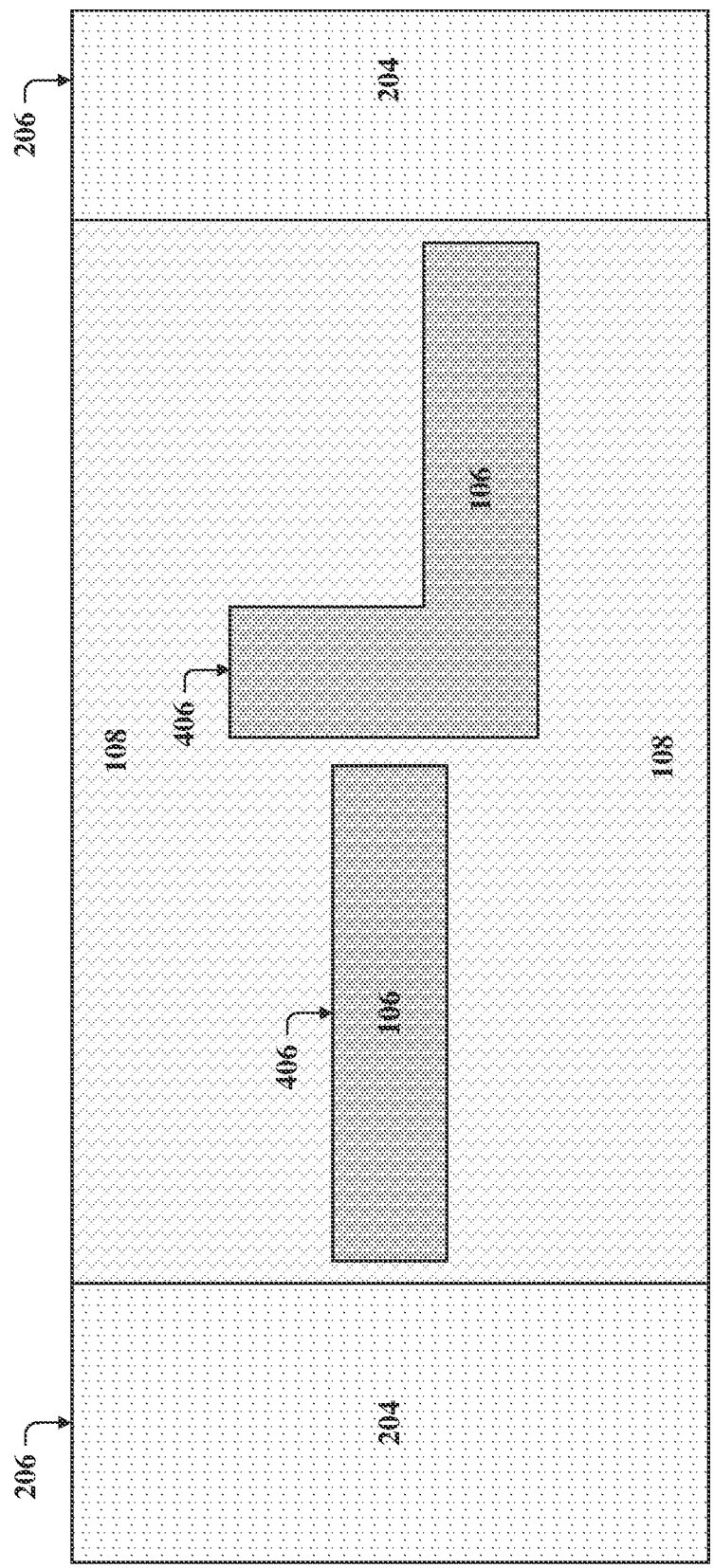

Electrode material 204 can be deposited on device 100 using a damascene fabrication process (not illustrated in the figures) to form electrodes 206 such that they are each coupled to substrate 104, removable layer 106, and/or cap layer 108 as depicted in FIGS. 2A and 4C. Although not illustrated in FIG. 2A or 2B, such a damascene fabrication process can comprise, for example: etching a trench in device 100 (e.g., etch a trench in substrate 104, removable layer 106, and/or cap layer 108); filing the trench with electrode material 204 (e.g., niobium (Nb), etc.) using one or more material deposition techniques defined above (e.g., evaporation techniques, sputtering techniques, CVD, ALD, PVD, MBE, ECD, epitaxial deposition, LPCVD, RTCVD, etc.); and/or polishing one or more surfaces of electrode material 204 to form electrodes 206 depicted in FIGS. 2A and 4C using, for instance, a polishing technique such as, for example, chemical-mechanical planarization (CMP). Each of electrodes 206 can comprise: a length (e.g., as defined along an axis of device 200 that extends horizontally across FIG. 2A) ranging from approximately 50 nm to approximately 10 mm; a thickness (e.g., a height defined along an axis of device 200 that extends vertically across FIG. 2A) ranging from approximately 110 nm to approximately 2.5 μm; and/or a width (e.g., a depth defined along an axis of device 200 that extends into and out of FIG. 2A) ranging from approximately 50 nm to approximately 10 mm.

Figure 3B:
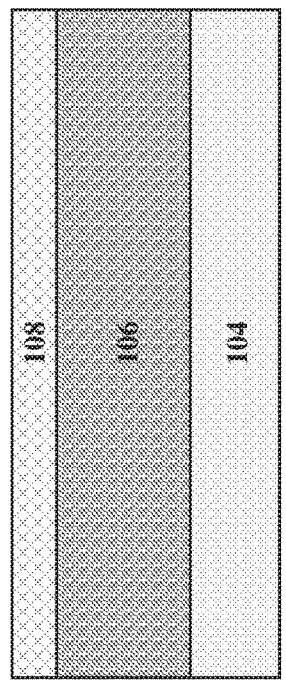

FIG. 3A illustrates a cross-sectional side view of an example, non-limiting device 300 that can facilitate a qubit device comprising a vacuum encapsulated Josephson junction in accordance with one or more embodiments described herein. Additionally, or alternatively, FIG. 3A illustrates a cross-sectional side view of the example, non-limiting device 200 of FIGS. 2A and 2B after forming a hardmask on the electrodes formed on device 200 in accordance with one or more embodiments described herein. FIG. 3B illustrates a cross-sectional side view of device 300 as viewed along a plane defined by line 302. Repetitive description of like elements and/or processes employed in other embodiments described herein is omitted for sake of brevity.

Device 300 can comprise an example, non-limiting alternative embodiment of device 200 after depositing hardmask material 304 on device 200 to form a hardmask 306 on electrodes 206 as illustrated in the example embodiment depicted in FIG. 3A. In some embodiments, hardmask material 304 can comprise a dielectric material such as, for example, silicon dioxide ($SiO_2$) and/or another dielectric material.

Hardmask 306 can be formed on device 200 as illustrated in the example embodiment depicted in FIG. 3A using one or more photolithography, patterning, photoresist, and/or etching techniques defined above (e.g., a lithographic patterning process, chemical vapor etch (CVE), reactive ion etching (RIE), dry etching, wet etching, ion beam etching, plasma etching, laser ablation, etc.). For example, although not illustrated in FIG. 3A or 3B, hardmask material 304 can be deposited on device 200 (e.g., on one or more surfaces (e.g., top, sides, etc.) of electrodes 206 and/or cap layer 108) using one or more material deposition techniques defined above (e.g., evaporation techniques, sputtering techniques, CVD, ALD, PVD, MBE, ECD, epitaxial deposition, LPCVD, RTCVD, etc.). In this example, based on such depositing of hardmask material 304 on device 200 as described above, a photoresist material (e.g., a positive-tone photoresist, a negative-tone photoresist, a hybrid-tone photoresist, etc.) can be formed and/or patterned on hardmask material 304 using one or more photolithography, patterning, and/or photoresist techniques defined above (e.g., a lithographic patterning process). In this example, the photoresist material can be formed and/or patterned on hardmask material 304 such that it defines the dimensions of hardmask 306, where such dimensions can extend past those of each electrode 206. For instance, the photoresist material can be formed and/or patterned on hardmask material 304 such that it has an approximately rectangular shaped footprint positioned over and/or overlapping electrodes 206 with dimensions that extend past the dimensions of electrodes 206. In this example, portions of hardmask material 304 can then be removed from device 200 using one or more etching techniques (e.g., CVE, RIE, dry etching, wet etching, ion beam etching, plasma etching, laser ablation, etc.) to form hardmask 306 illustrated in the example embodiment depicted in FIG. 3A. In this example, based on removal of such portions of hardmask material 304 as described above, the dimensions of hardmask 306 can thereby comprise a length (e.g., as defined along an axis of device 300 that extends horizontally across FIG. 3A) and a width (e.g., a depth defined along an axis of device 300 that extends into and out of FIG. 3A) that are greater than the length and width, respectively, of electrodes 206, which enables hardmask 306 to completely cover each electrode 206 as depicted in the example embodiment illustrated in FIG. 3A. In this example, the remaining portion of the photoresist material on hardmask 306 can be removed using a lift off technique (e.g., washing with a solvent, stripping, etc.) to yield device 300 illustrated in FIGS. 3A and 3B. Hardmask 306 can comprise a thickness (e.g., a height) ranging from approximately 10 nm to approximately 500 nm.

It should be appreciated that hardmask 306 can protect electrodes 206 from being damaged during subsequent fabrication steps described below that can be implemented to develop device 900 and/or other subsequent fabrication steps that can be implemented to develop another device that can comprise device 900 (e.g., a quantum computer, a quantum processor, quantum hardware, etc.). It should also be appreciated that hardmask 306 can further serve as an anchor to couple various components of device 900 to one another as described below. For example, as illustrated in FIGS. 6A-9B, hardmask 306 can serve as an anchor to couple first superconducting material 606, second superconducting material 706, and/or third superconducting material 806 to device 900. In some embodiments, one or more portions of hardmask 306 can be removed to expose one or more surfaces of electrodes 206. In these embodiments, such one or more portions of hardmask 306 can be removed using one or more photolithography, patterning, photoresist, and/or etching techniques defined above (e.g., a lithographic patterning process, CVE, RIE, dry etching, wet etching, ion beam etching, plasma etching, laser ablation, etc.).

FIG. 4A illustrates a cross-sectional side view of an example, non-limiting device 400 that can facilitate a qubit device comprising a vacuum encapsulated Josephson junction in accordance with one or more embodiments described herein. Additionally, or alternatively, FIG. 4A illustrates a cross-sectional side view of the example, non-limiting device 300 of FIGS. 3A and 3B after removing portions of one or more material layers from device 300 in accordance with one or more embodiments described herein. FIG. 4B illustrates a cross-sectional side view of device 400 as viewed along a plane defined by line 402. FIG. 4C illustrates a cross-sectional top view of device 400 as viewed along a plane defined by line 404. Repetitive description of like elements and/or processes employed in other embodiments described herein is omitted for sake of brevity.

Device 400 can comprise an example, non-limiting alternative embodiment of device 300 after removing portions of cap layer 108 and/or removable layer 106 to form one or more ports 406 that can enable access to removable layer 106. For example, such one or more ports 406 can enable removal of a portion of removable layer 106 as described below with reference to FIGS. 5A, 5B, and 5C.

Each of such one or more ports 406 can be formed in cap layer 108 as illustrated in the example embodiment depicted in FIGS. 4A, 4B, and 4C. The example embodiment illustrated in FIG. 4C depicts a cross-sectional top view of device 400 and ports 406 formed in cap layer 108. The example embodiment illustrated in FIG. 4C further depicts multiple electrodes 206 (e.g., two electrodes 206), where hardmask 306 is not shown for clarity. In this example embodiment, each of such electrodes 206 can be formed using the same techniques and/or materials described above with reference to FIGS. 2A and 2B. In this example embodiment, one or more ports 406 can be formed in cap layer 108 using one or more photolithography, patterning, photoresist, and/or etching techniques defined above (e.g., a lithographic patterning process, CVE, RIE, dry etching, wet etching, ion beam etching, plasma etching, laser ablation, etc.). For example, although not illustrated in FIG. 4A, 4B, or 4C, a photoresist material (e.g., a positive-tone photoresist, a negative-tone photoresist, a hybrid-tone photoresist, etc.) can be formed and/or patterned on cap layer 108 to define the shape and/or dimensions of one or more ports 406 on cap layer 108. In this example, based on forming and/or patterning the photoresist material on cap layer 108 to define the shape and/or dimensions of one or more ports 406, an etching process (e.g., CVP, RIE, dry etching, wet etching, ion beam etching, plasma etching, laser ablation, etc.) can be performed to remove portions of cap layer 108 and removable layer 106, thereby yielding one or more ports 406 illustrated in FIGS. 4A, 4B, and 4C. In this example, based on removing portions of cap layer 108 to form one or more ports 406, the photoresist material can be removed using a lift off technique (e.g., washing with a solvent, stripping, etc.).

Figure 5A:
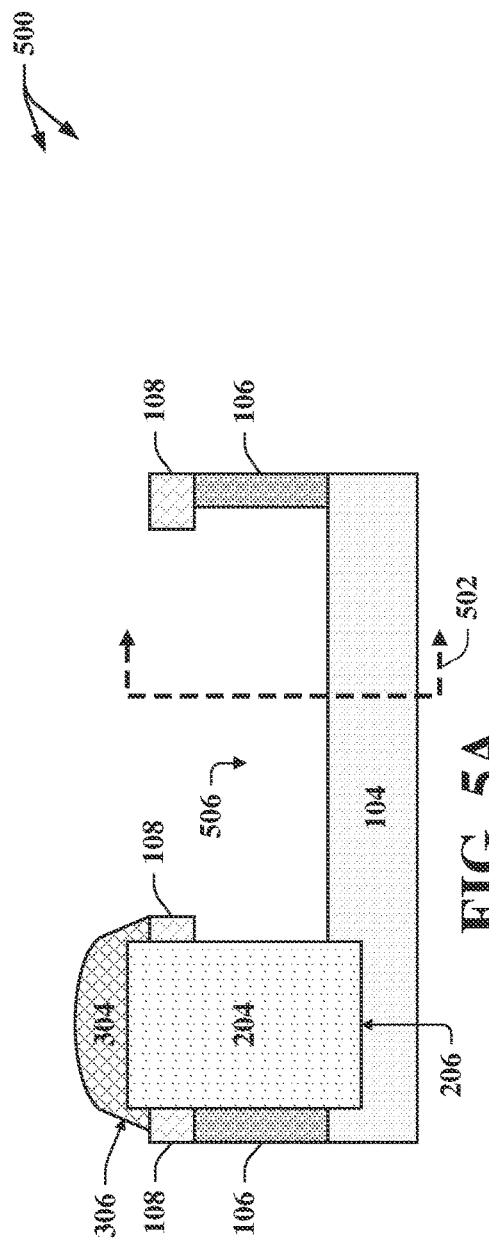
FIGS. 5A, 5B, and 5C illustrate cross-sectional side and top views of the example, non-limiting device of FIGS. 4A, 4B, and 4C after removing a portion of a removable layer from the device of FIGS. 4A, 4B, and 4C to form a cavity in accordance with one or more embodiments described herein.
Figure 5B:
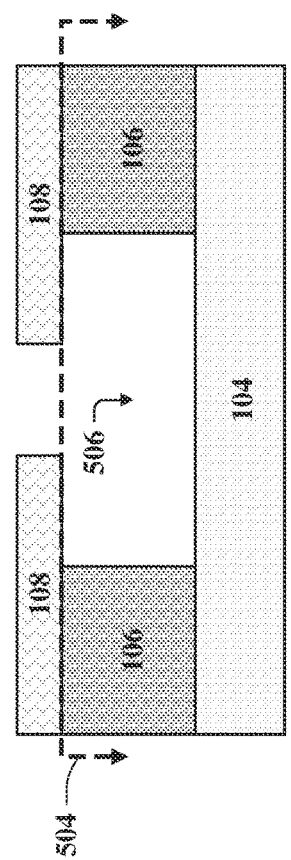
Figure 5C:
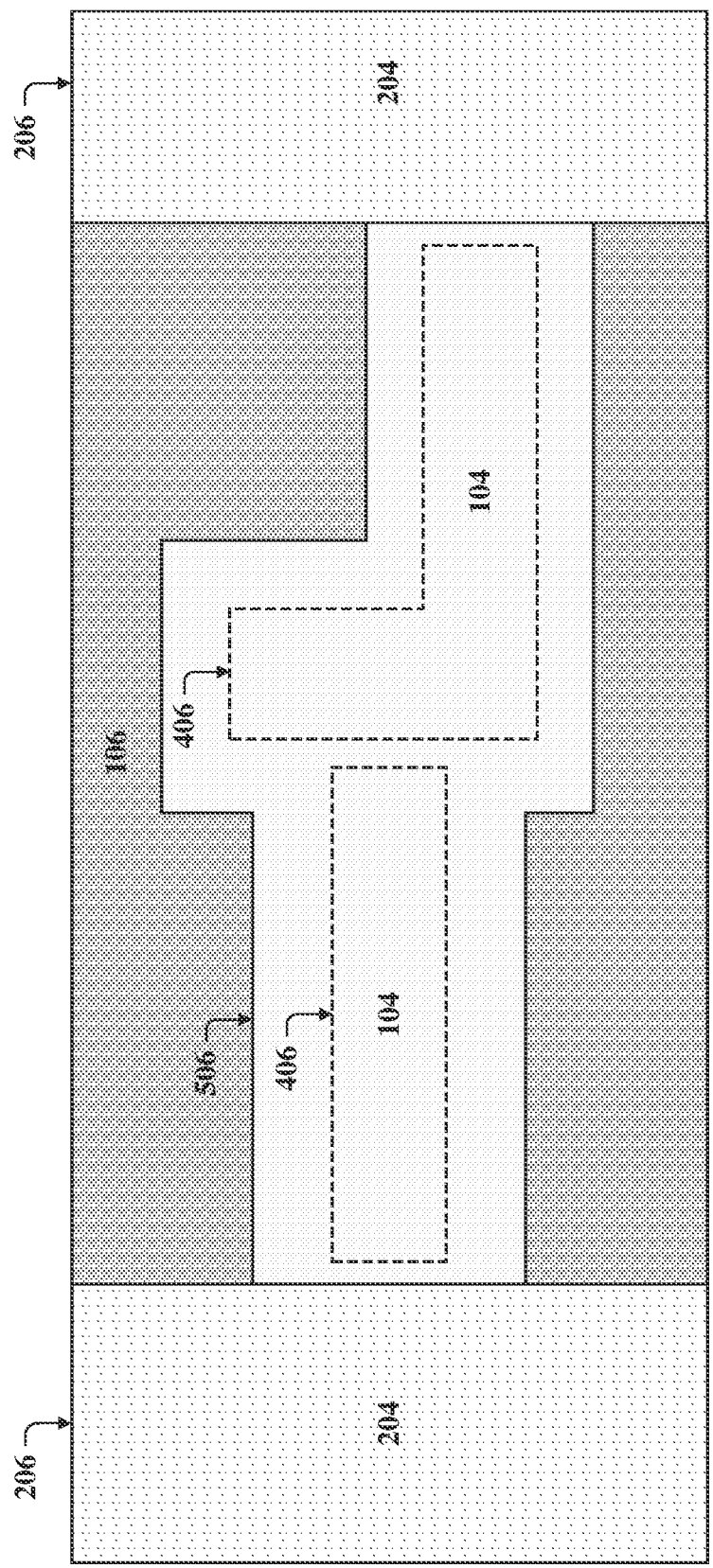

FIG. 5A illustrates a cross-sectional side view of an example, non-limiting device 500 that can facilitate a qubit device comprising a vacuum encapsulated Josephson junction in accordance with one or more embodiments described herein. Additionally, or alternatively, FIG. 5A illustrates a cross-sectional side view of the example, non-limiting device 400 of FIGS. 4A, 4B, and 4C after removing a portion of a removable layer from device 300 to form a cavity in accordance with one or more embodiments described herein. FIG. 5B illustrates a cross-sectional side view of device 500 as viewed along a plane defined by line 502. FIG. 5C illustrates a cross-sectional top view of device 500 as viewed along a plane defined by line 504. Repetitive description of like elements and/or processes employed in other embodiments described herein is omitted for sake of brevity.

Device 500 can comprise an example, non-limiting alternative embodiment of device 400 after removing a portion of removable layer 106 to form a cavity 506 as illustrated in the example embodiment depicted in FIGS. 5A, 5B, and 5C. In this example embodiment, such a portion of removable layer 106 can be removed using one or more etching techniques defined herein (e.g., CVP, RIE, dry etching, wet etching, ion beam etching, plasma etching, laser ablation, etc.) to form cavity 506 illustrated in FIGS. 5A, 5B, and 5C. The example embodiment depicted in FIG. 5C illustrates a cross-sectional top view of cavity 506 formed in device 500, where cap layer 108 has been removed for clarity and the edges of ports 406 are depicted as dashed lines for reference.

Figures 6A, 6B:
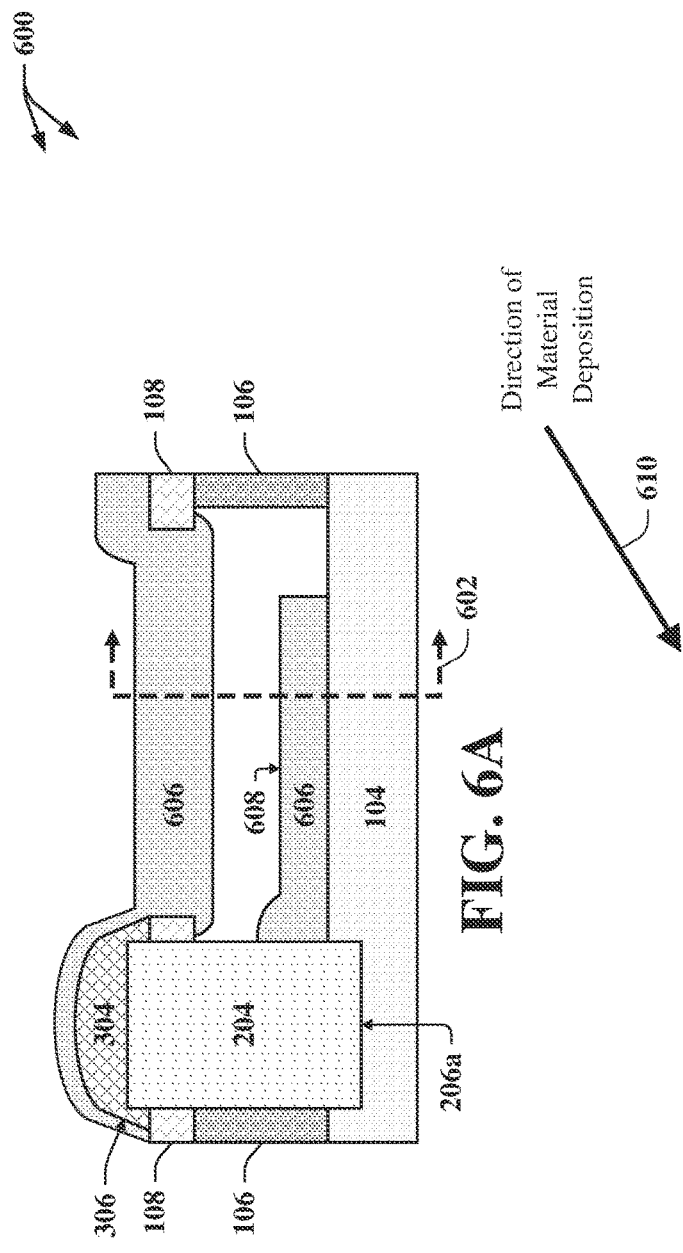
FIGS. 6A, 6B, and 6C illustrate cross-sectional side and top views of the example, non-limiting device of FIGS. 5A, 5B, and 5C after forming first superconducting features inside the cavity of the device of FIGS. 5A, 5B, and 5C in accordance with one or more embodiments described herein.
Figure 6C:
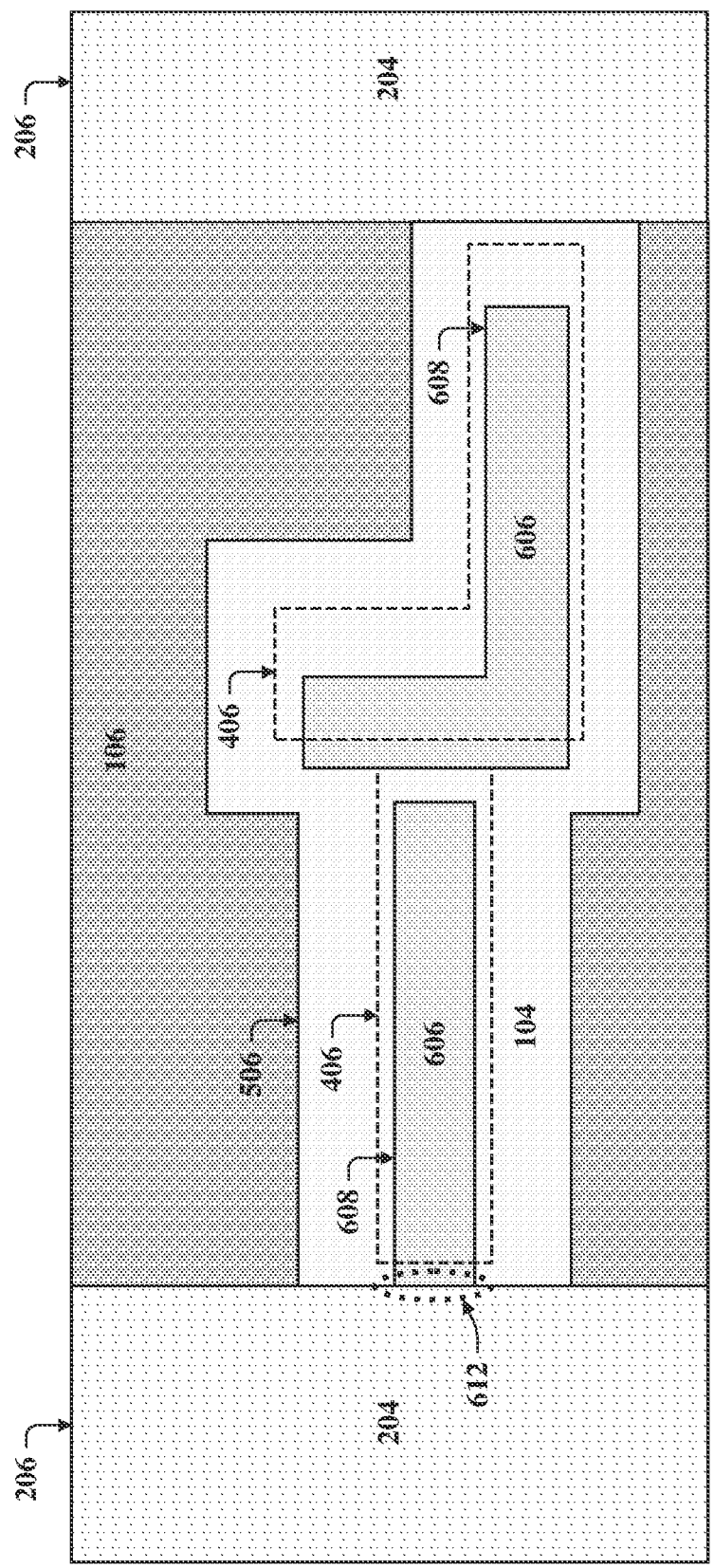

FIG. 6A illustrates a cross-sectional side view of an example, non-limiting device 600 that can facilitate a qubit device comprising a vacuum encapsulated Josephson junction in accordance with one or more embodiments described herein. Additionally, or alternatively, FIG. 6A illustrates a cross-sectional side view of the example, non-limiting device 500 of FIGS. 5A, 5B, and 5C after forming first superconducting features inside the cavity of device 500 in accordance with one or more embodiments described herein. FIG. 6B illustrates a cross-sectional side view of device 600 as viewed along a plane defined by line 602. FIG. 6C illustrates a cross-sectional top view of device 600 as viewed along a plane defined by line 604. Repetitive description of like elements and/or processes employed in other embodiments described herein is omitted for sake of brevity.

Device 600 can comprise an example, non-limiting alternative embodiment of device 500 after depositing a first superconducting material 606 onto cap layer 108 and portions of substrate 104 inside cavity 506 to form first superconducting features 608 (e.g., first superconducting components) inside cavity 506 as illustrated in the example embodiment depicted in FIGS. 6A, 6B, and 6C. In some embodiments, first superconducting material 606 can comprise a superconducting material such as, for instance, aluminum (Al) and/or another superconducting material. In these embodiments, first superconducting features 608 can comprise first superconducting features that can be formed inside cavity 506 as described below.

First superconducting material 606 can be deposited onto cap layer 108 and portions of substrate 104 inside cavity 506 using one or more material deposition techniques defined above (e.g., evaporation techniques, sputtering techniques, CVD, ALD, PVD, MBE, ECD, epitaxial deposition, LPCVD, RTCVD, etc.). In some embodiments such a deposition technique may lead to a replication of the crystalline structure of the underlying material to the deposited material. For example, first superconducting material 606 can be deposited onto cap layer 108 and portions of substrate 104 inside cavity 506 using an angled directional deposition technique, where first superconducting material 606 can be deposited at a certain angle represented by arrow 610 in FIG. 6B. In this example, such an angled directional deposition technique can be used to enable deposition of first superconducting material 606 onto cap layer 108 and portions of substrate 104 inside cavity 506 at a certain angle to form first superconducting features 608 on substrate 104 inside cavity 506 as depicted in FIGS. 6A, 6B, and 6C. As illustrated in the example embodiment depicted in FIG. 6C, by using such an angled directional deposition technique to deposit first superconducting material 606 as described above, one of such first superconducting features 608 can be coupled to one of electrodes 206, for example, via a galvanic contact 612 between electrode material 204 and first superconducting material 606. Each of such first superconducting features 608 can comprise a thickness (e.g., a height) ranging from approximately 10 nm to approximately 100 nm.

Figure 7A:
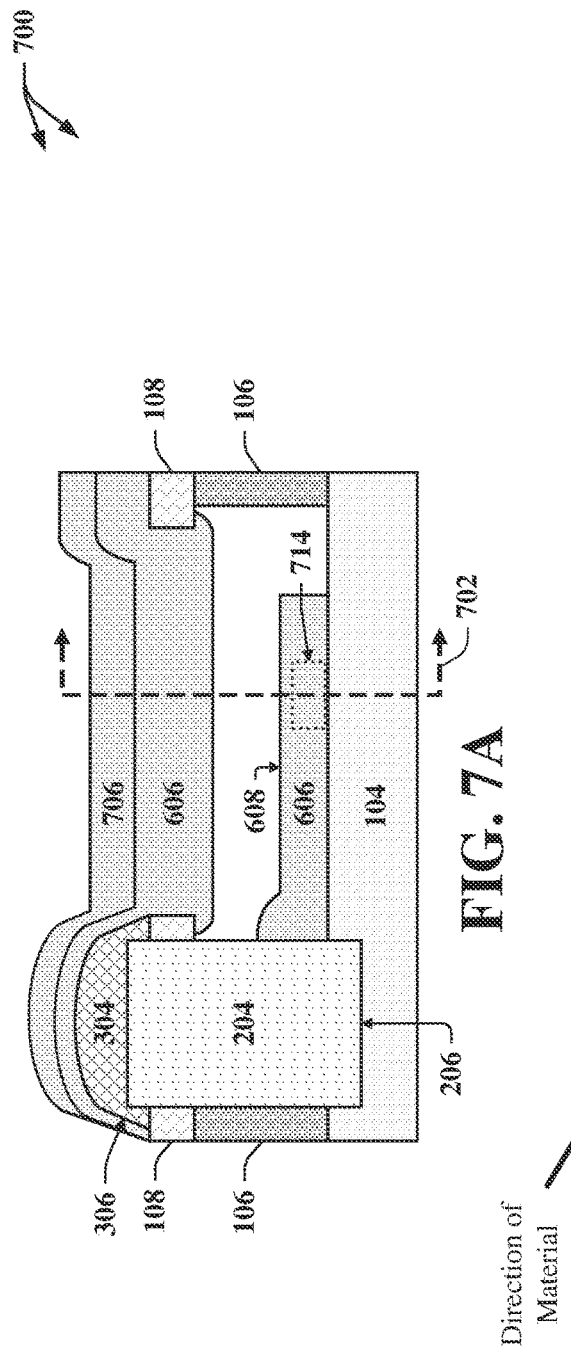
FIGS. 7A, 7B, and 7C illustrate cross-sectional side and top views of the example, non-limiting device of FIGS. 6A, 6B, and 6C after forming second superconducting features inside the cavity of the device of FIGS. 6A, 6B, and 6C in accordance with one or more embodiments described herein.
Figure 7B:
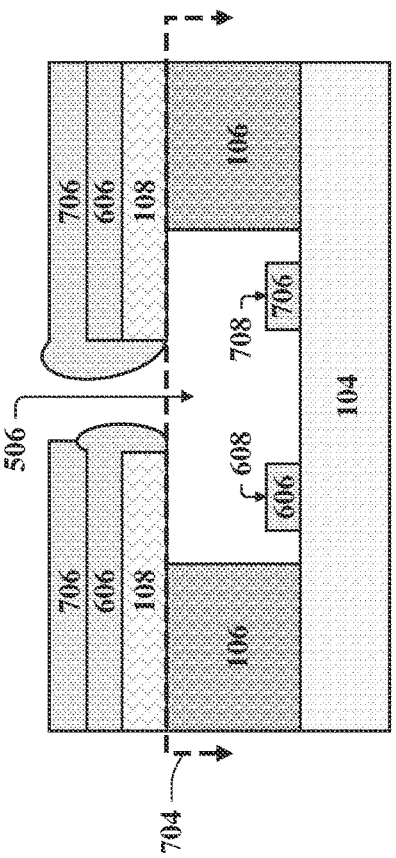
Figure 7C:
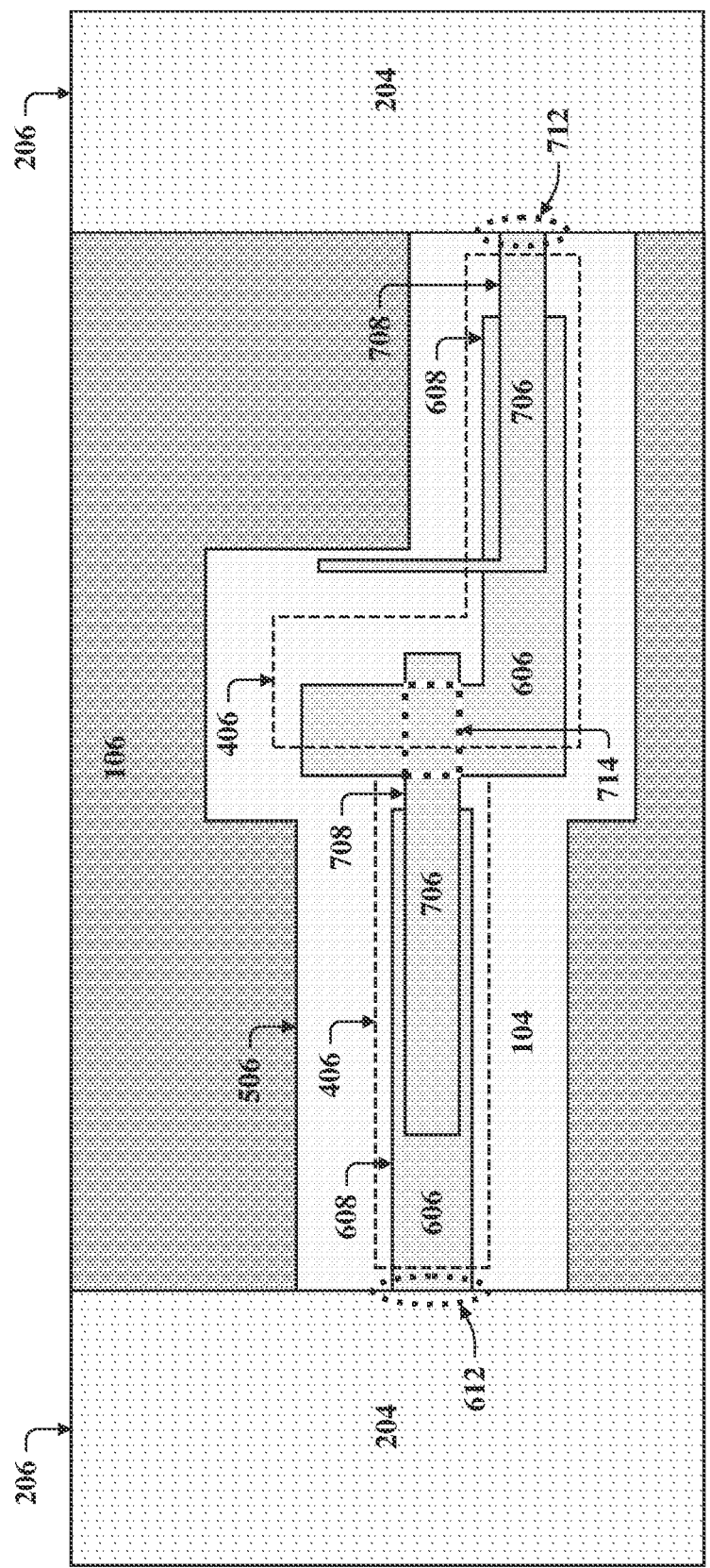

FIG. 7A illustrates a cross-sectional side view of an example, non-limiting device 700 that can facilitate a qubit device comprising a vacuum encapsulated Josephson junction in accordance with one or more embodiments described herein. Additionally, or alternatively, FIG. 7A illustrates a cross-sectional side view of the example, non-limiting device 600 of FIGS. 6A, 6B, and 6C after forming second superconducting features inside the cavity of device 600 in accordance with one or more embodiments described herein. FIG. 7B illustrates a cross-sectional side view of device 700 as viewed along a plane defined by line 702. FIG. 7C illustrates a cross-sectional top view of device 700 as viewed along a plane defined by line 704. Repetitive description of like elements and/or processes employed in other embodiments described herein is omitted for sake of brevity.

Device 700 can comprise an example, non-limiting alternative embodiment of device 600 after depositing a second superconducting material 706 onto cap layer 108 and/or first superconducting material 606, as well as portions of first superconducting features 608 and substrate 104 inside cavity 506 to form second superconducting features 708 (e.g., second superconducting components) inside cavity 506 as illustrated in the example embodiment depicted in FIGS. 7A, 7B, and 7C. In some embodiments, second superconducting material 706 can comprise a superconducting material such as, for instance, aluminum (Al) and/or another superconducting material. In these embodiments, second superconducting features 708 can comprise second superconducting features that can be formed inside cavity 506 as described below.

Second superconducting material 706 can be deposited onto cap layer 108 and/or first superconducting material 606, as well as portions of first superconducting features 608 and substrate 104 inside cavity 506 using one or more material deposition techniques defined above (e.g., evaporation techniques, sputtering techniques, CVD, ALD, PVD, MBE, ECD, epitaxial deposition, LPCVD, RTCVD, etc.). In some embodiments such a deposition technique may lead to a replication of the crystalline structure of the underlying material to the deposited material. For example, example, second superconducting material 706 can be deposited onto cap layer 108 and/or first superconducting material 606, as well as portions of first superconducting features 608 and substrate 104 inside cavity 506 using an angled directional deposition technique, where second superconducting material 706 can be deposited at a certain angle represented by arrow 710 in FIG. 7B. In this example, such an angled directional deposition technique can be used to enable deposition of second superconducting material 706 onto cap layer 108 and/or first superconducting material 606, as well as portions of first superconducting features 608 and substrate 104 inside cavity 506 at a certain angle to form second superconducting features 708 on first superconducting features 608 and substrate 104 inside cavity 506 as depicted in FIGS. 7A, 7B, and 7C. As illustrated in the example embodiment depicted in FIG. 7C, by using such an angled directional deposition technique to deposit second superconducting material 706 as described above, one of such second superconducting features 708 can be coupled to one of electrodes 206, for example, via a galvanic contact 712 between electrode material 204 and second superconducting material 706. Each of such second superconducting features 708 can comprise a thickness (e.g., a height) ranging from approximately 10 nm to approximately 100 nm. As illustrated in the example embodiment depicted in FIGS. 7A and 7C, by using such an angled directional deposition technique to deposit second superconducting material 706 as described above, one of such second superconducting features 708 can overlap and be coupled to one of electrodes 206 to form a Josephson junction 714 represented by a rectangle with a dashed line in FIGS. 7A and 7C.

In some embodiments, before depositing second superconducting material 706, a defined amount of controlled oxidizing ambient can be allowed to enter into cavity 506 to form a tunnel oxide layer (e.g., a relatively thin tunnel oxide layer, not illustrated in the figures) on first superconducting features 608. In these embodiments, such a tunnel oxide layer can form a tunnel contact between first superconducting material 606 of first superconducting features 608 and second superconducting material 706 of second superconducting features 708. Additionally, or alternatively, in these embodiments, such a tunnel oxide layer can form a tunnel barrier for Josephson junction 714 that can be developed in cavity 506 as described above. It should be appreciated that such a tunnel oxide layer can constitute a relatively small amount of oxide (e.g., approximately negligible) when compared to an amount of oxide that would form if first superconducting material 606 and other components of device 600 (e.g., substrate 104, removable layer 106, electrodes 206, etc.) were exposed to atmosphere at room temperature.

Figure 8A:
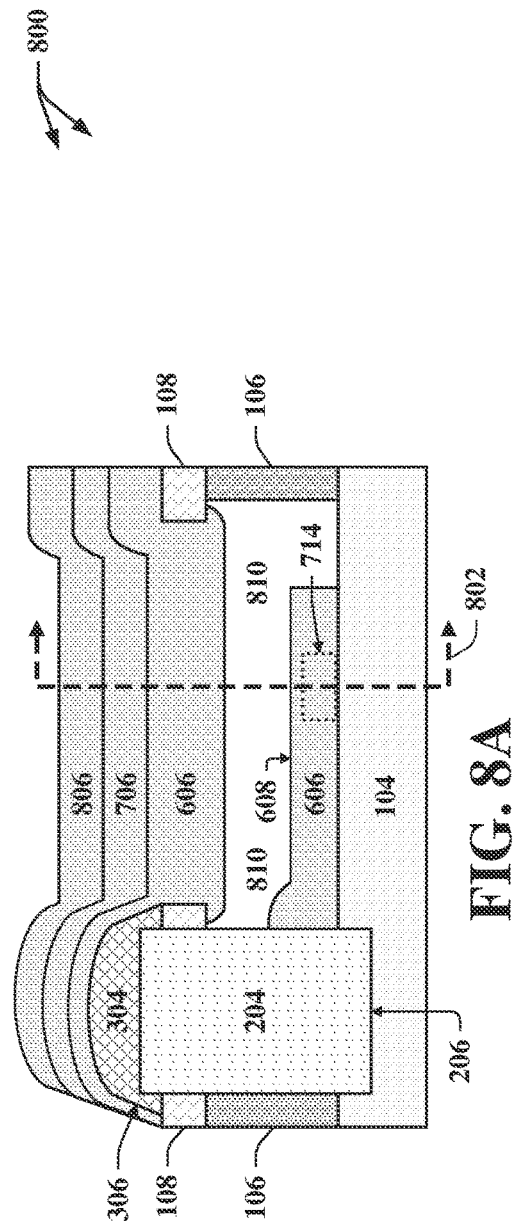
FIGS. 8A, 8B, and 8C illustrate cross-sectional side and top views of the example, non-limiting device of FIGS. 7A, 7B, and 7C after forming third superconducting features inside the cavity of the device of FIGS. 7A, 7B, and 7C and hermetically sealing the cavity in accordance with one or more embodiments described herein.
Figure 8B:
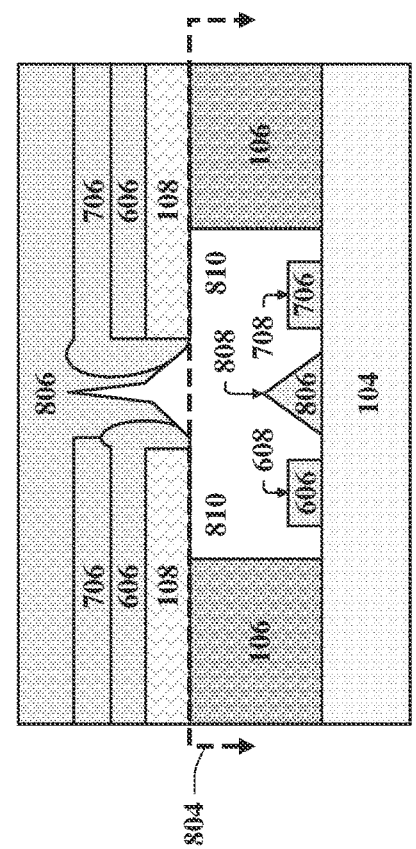
Figure 8C:
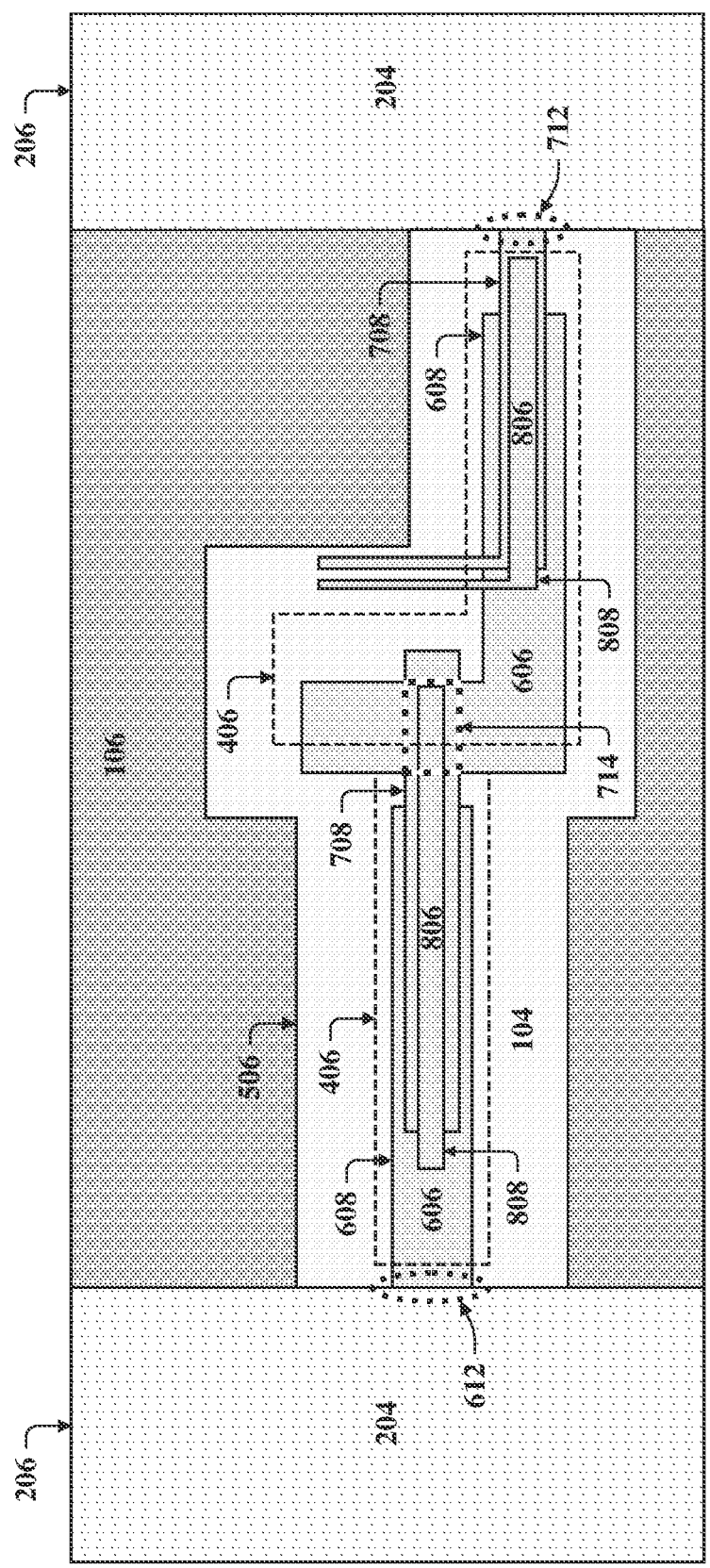

FIG. 8A illustrates a cross-sectional side view of an example, non-limiting device 800 that can facilitate a qubit device comprising a vacuum encapsulated Josephson junction in accordance with one or more embodiments described herein. Additionally, or alternatively, FIG. 8A illustrates a cross-sectional side view of the example, non-limiting device 700 of FIGS. 7A, 7B, and 7C after forming third superconducting features inside the cavity of device 700 and hermetically sealing the cavity in accordance with one or more embodiments described herein. FIG. 8B illustrates a cross-sectional side view of device 800 as viewed along a plane defined by line 802. FIG. 8C illustrates a cross-sectional top view of device 800 as viewed along a plane defined by line 804. Repetitive description of like elements and/or processes employed in other embodiments described herein is omitted for sake of brevity.

Device 800 can comprise an example, non-limiting alternative embodiment of device 700 after depositing a third superconducting material 806 onto cap layer 108, first superconducting material 606, and/or second superconducting material 706, as well as portions of first superconducting features 608, second superconducting features 708, and/or substrate 104 inside cavity 506 to form third superconducting features 808 (e.g., third superconducting components) inside cavity 506 as illustrated in the example embodiment depicted in FIGS. 8A, 8B, and 8C. In some embodiments, third superconducting material 806 can comprise a superconducting material such as, for instance, aluminum (Al) and/or another superconducting material. In these embodiments, third superconducting features 808 can comprise third superconducting features that can be formed inside cavity 506 as described below.

Third superconducting material 806 can be deposited onto cap layer 108, first superconducting material 606, and/or second superconducting material 706, as well as portions of first superconducting features 608, second superconducting features 708, and/or substrate 104 inside cavity 506 using one or more material deposition techniques defined above (e.g., evaporation techniques, sputtering techniques, CVD, ALD, PVD, MBE, ECD, epitaxial deposition, LPCVD, RTCVD, etc.). In some embodiments such a deposition technique may lead to a replication of the crystalline structure of the underlying material to the deposited material. For example, third superconducting material 806 can be deposited onto cap layer 108, first superconducting material 606, and/or second superconducting material 706, as well as portions of first superconducting features 608, second superconducting features 708, and/or substrate 104 inside cavity 506 using a zero degree (0°) angled directional deposition technique. In this example, such a zero degree (0°) angled directional deposition technique can be used to enable deposition of third superconducting material 806 onto cap layer 108, first superconducting material 606, and/or second superconducting material 706, as well as portions of first superconducting features 608, second superconducting features 708, and/or substrate 104 inside cavity 506 at a zero degree (0°) angle to form third superconducting features 808 on first superconducting features 608, second superconducting features 708, and/or substrate 104 inside cavity 506 as depicted in FIGS. 8A, 8B, and 8C. Each of such third superconducting features 808 can comprise a thickness (e.g., a height) ranging from approximately 100 nm to approximately 1.5 μm.

As illustrated in the example embodiment depicted in FIGS. 8A and 8B, third superconducting material 806 can be deposited (e.g., using such a zero degree (0°) angled directional deposition technique described above) until it encloses and hermetically seals cavity 506. In this example embodiment, based on such deposition of third superconducting material 806 as described above, third superconducting material 806 can further encapsulate vacuum inside cavity 506 to form an encapsulated vacuum cavity 810 having such vacuum and one or more superconducting components (e.g., electrodes 206, first superconducting features 608, second superconducting features 708, Josephson junction 714, third superconducting features 808, etc.). In some embodiments, such one or more superconducting components (e.g., electrodes 206, first superconducting features 608, second superconducting features 708, Josephson junction 714, third superconducting features 808, etc.) can constitute a superconducting circuit. For example, such one or more superconducting components (e.g., electrodes 206, first superconducting features 608, second superconducting features 708, Josephson junction 714, third superconducting features 808, etc.) can constitute a qubit and/or a qubit circuit. For instance, such one or more superconducting components (e.g., electrodes 206, first superconducting features 608, second superconducting features 708, Josephson junction 714, third superconducting features 808, etc.) can constitute a transmon qubit and/or a transmon qubit circuit.

Figure 9A:
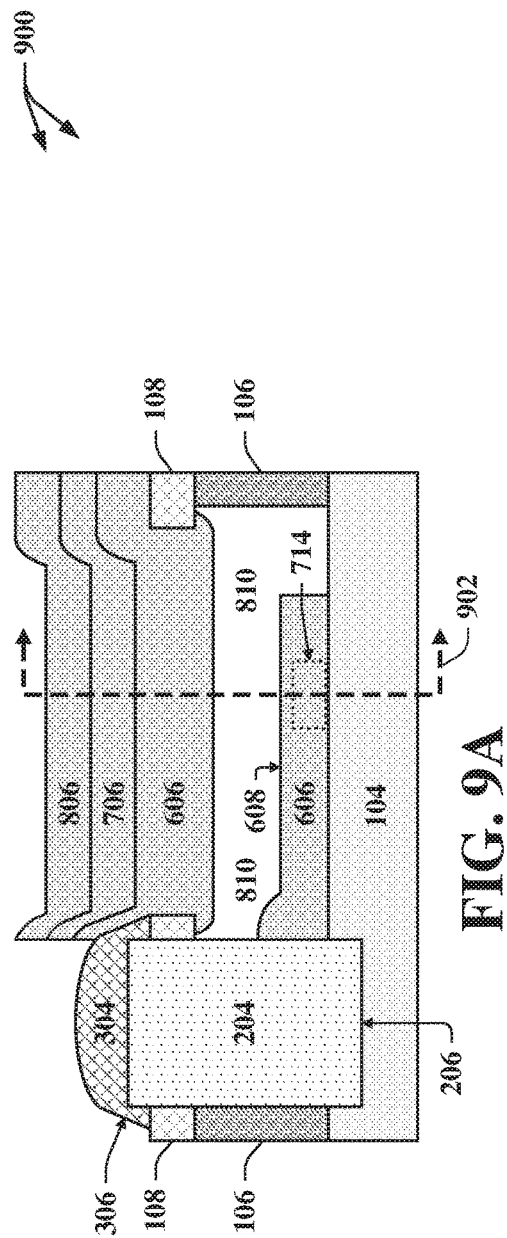
FIGS. 9A and 9B illustrate cross-sectional side views of the example, non-limiting device of FIGS. 8A, 8B, and 8C after removal of portions of the first superconducting material, the second superconducting material, and/or the third superconducting material from the device of FIGS. 8A, 8B, and 8C in accordance with one or more embodiments described herein.
Figure 9B:
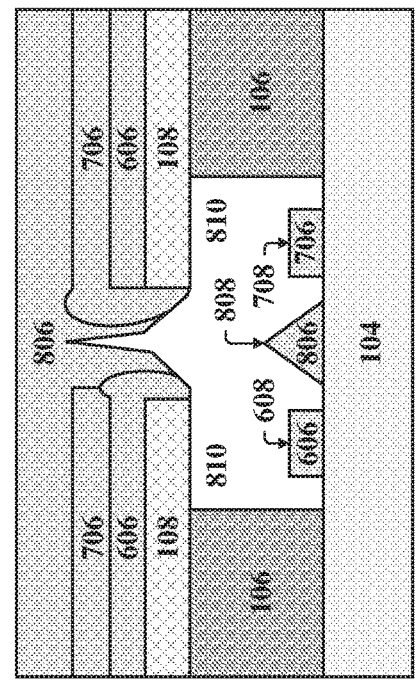

FIG. 9A illustrates a cross-sectional side view of an example, non-limiting device 900 that can facilitate a qubit device comprising a vacuum encapsulated Josephson junction in accordance with one or more embodiments described herein. Additionally, or alternatively, FIG. 9A illustrates a cross-sectional side view of the example, non-limiting device 800 of FIGS. 8A, 8B, and 8C after removal of portions of the first superconducting material, the second superconducting material, and/or the third superconducting material from device 800 in accordance with one or more embodiments described herein. FIG. 9B illustrates a cross-sectional side view of device 900 as viewed along a plane defined by line 902.

Device 900 can comprise an example, non-limiting alternative embodiment of device 800 after removal of portions of first superconducting material 606, second superconducting material 706, and/or third superconducting material 806 from device 800 as illustrated in the example embodiment depicted in FIGS. 9A and 9B. For example, device 900 can comprise an example, non-limiting alternative embodiment of device 800 after removal of portions of first superconducting material 606, second superconducting material 706, and/or third superconducting material 806 from portions of hardmask 306 and/or cap layer 108 as described below and illustrated in the example embodiment depicted in FIG. 9A.

In the above example, portions of first superconducting material 606, second superconducting material 706, and/or third superconducting material 806 can be removed from portions of hardmask 306 and/or cap layer 108 using one or more photolithography, patterning, photoresist, and/or etching techniques defined above (e.g., a lithographic patterning process, CVE, CMP, RIE, dry etching, wet etching, ion beam etching, plasma etching, laser ablation, etc.). For example, although not illustrated in FIG. 9A or 9B, a photoresist material (e.g., a positive-tone photoresist, a negative-tone photoresist, a hybrid-tone photoresist, etc.) can be formed and/or patterned on third superconducting material 806 to define the shape and/or dimensions of one or more sections of first superconducting material 606, second superconducting material 706, and/or third superconducting material 806 that can be removed from hardmask 306 and/or cap layer 108. In this example, based on forming and/or patterning the photoresist material on third superconducting material 806 to define the shape and/or dimensions of such one or more sections that can be removed, an etching and/or polishing process (e.g., CVP, RIE, dry etching, wet etching, ion beam etching, plasma etching, laser ablation, CMP, backgrinding, etc.) can be performed to remove portions of first superconducting material 606, second superconducting material 706, and/or third superconducting material 806 as illustrated in FIG. 9A. In this example, based on removing such portions of first superconducting material 606, second superconducting material 706, and/or third superconducting material 806, the photoresist material can be removed using a lift off technique (e.g., washing with a solvent, stripping, etc.), thereby yielding device 900 illustrated in FIGS. 9A and 9B.

In the example embodiment depicted in FIGS. 9A and 9B, as encapsulated vacuum cavity 810 can be hermetically sealed and can comprise vacuum and one or more superconducting components (e.g., electrodes 206, first superconducting features 608, second superconducting features 708, Josephson junction 714, third superconducting features 808, etc.), device 900 and/or encapsulated vacuum cavity 810 can facilitate: improved protection of and/or stability of such one or more superconducting components; reduced error rates associated with device 900; improved accuracy of device 900; and/or improved fidelity of device 900. Additionally, or alternatively, in the example embodiment depicted in FIGS. 9A and 9B, as encapsulated vacuum cavity 810 can be hermetically sealed and can comprise vacuum and Josephson junction 714, device 900 and/or encapsulated vacuum cavity 810 can thereby enable Josephson junction 714 to be positioned in a low-loss material (e.g., the vacuum in encapsulated vacuum cavity 810), which can facilitate improved performance (e.g., accuracy) and/or improved stability of a superconducting circuit (e.g., a transmon qubit) comprising Josephson junction 714.

It should be appreciated that encapsulated vacuum cavity 810, which can be hermetically sealed and can comprise vacuum and one or more superconducting components (e.g., electrodes 206, first superconducting features 608, second superconducting features 708, Josephson junction 714, third superconducting features 808, etc.), can protect such one or more superconducting components from being damaged during subsequent fabrication steps that can be implemented to further develop device 900 and/or other subsequent fabrication steps that can be implemented to develop another device that can comprise device 900 (e.g., a quantum computer, a quantum processor, quantum hardware, etc.). Additionally, or alternatively, it should be appreciated that by providing such protection to such one or more superconducting components, device 900 and/or encapsulated vacuum cavity 810 can thereby prevent or mitigate degradation of the properties (e.g., chemical, electrical, electromagnetic, etc.) associated with such one or more superconducting components and/or device 900. For example, it should be appreciated that device 900 and/or encapsulated vacuum cavity 810 can thereby prevent or mitigate degradation of quantum related properties such as, for instance, critical current, qubit frequency, fidelity, energy loss, electric field loss, loss tangent, participation ratio, and/or another quantum related property associated with such one or more superconducting components and/or device 900.

Device 900 can be associated with various technologies. For example, device 900 can be associated with semiconductor and/or superconductor device technologies, semiconductor and/or superconductor device fabrication technologies, quantum computing device technologies, quantum computing device fabrication technologies, qubit device technologies, qubit device fabrication technologies, and/or other technologies.

Device 900 can provide technical improvements to the various technologies listed above. For example, device 900 can comprise a qubit device that can be implemented in a quantum computing device (e.g., a quantum processor, quantum computer, etc.) to facilitate improved quantum computing. For instance, as described above, encapsulated vacuum cavity 810 can be hermetically sealed with vacuum and one or more superconducting components (e.g., electrodes 206, first superconducting features 608, second superconducting features 708, Josephson junction 714, third superconducting features 808, etc.) encapsulated inside. In this example, device 900 and/or encapsulated vacuum cavity 810 can thereby facilitate: improved protection of and/or stability of such one or more superconducting components; reduced error rates associated with device 900; improved accuracy of device 900; and/or improved fidelity of device 900.

In the above example, device 900 and/or encapsulated vacuum cavity 810 can protect such one or more superconducting components from being damaged during subsequent fabrication steps that can be implemented to further develop device 900 and/or other subsequent fabrication steps that can be implemented to develop another device that can comprise device 900 (e.g., a quantum computer, a quantum processor, quantum hardware, etc.). It should be appreciated that by providing such protection to such one or more superconducting components, device 900 and/or encapsulated vacuum cavity 810 can thereby prevent or mitigate degradation of the properties (e.g., chemical, electrical, electromagnetic, etc.) associated with such one or more superconducting components and/or device 900. For example, it should be appreciated that device 900 and/or encapsulated vacuum cavity 810 can thereby prevent or mitigate degradation of quantum related properties such as, for instance, critical current, qubit frequency, fidelity, energy loss, electric field loss, loss tangent, participation ratio, and/or another quantum related property associated with such one or more superconducting components and/or device 900.

In another example, as described above, encapsulated vacuum cavity 810 can be hermetically sealed with vacuum and Josephson junction 714 encapsulated inside. In this example, device 900 and/or encapsulated vacuum cavity 810 can thereby provide such a Josephson junction 714 in a low-loss material (e.g., the vacuum in encapsulated vacuum cavity 810), which can facilitate improved performance (e.g., accuracy) and/or improved stability of a superconducting circuit (e.g., a transmon qubit) comprising Josephson junction 714.

Device 900 can provide technical improvements to a processing unit associated with and/or comprising device 900. For example, as described above, encapsulated vacuum cavity 810 of device 900 can facilitate reduced error rates associated with device 900, improved accuracy of device 900, and/or improved fidelity of device 900, and thus, can thereby enable improved performance, accuracy, and/or fidelity of a quantum computing device comprising device 900. In this example, such a quantum computing device can comprise a processing unit such as, for example, a quantum processor comprising one or more of device 900. Such improvement(s) to such a processing unit can further facilitate improved efficiency of the processing unit, as well as reduced computational costs of the processing unit.

A practical application of device 900 is that it can be implemented in a quantum computing device (e.g., a quantum processor, a quantum computer, etc.) to improve processing fidelity, processing performance, and/or processing costs of such a device, which can facilitate fast and/or possibly universal quantum computing. Such a practical application can improve the output (e.g., computation and/or processing results) of one or more compilation jobs (e.g., quantum computing jobs) that are executed on such a devices. In an example, a practical application of device 900 is that it can be implemented in a quantum computing device (e.g., a quantum processor, a quantum computer, etc.) that can be used to compute one or more solutions (e.g., heuristic(s), etc.) to a variety of problems ranging in complexity (e.g., an estimation problem, an optimization problem, etc.) in a variety of domains (e.g., finance, chemistry, medicine, etc.). For instance, a practical application of device 900 is that it can be implemented in such a quantum computing device that can be used to compute one or more solutions (e.g., heuristic(s), etc.) to an optimization problem in the domain of chemistry, medicine, and/or finance, where such a solution can be used to engineer, for instance, a new chemical compound, a new medication, and/or a new option premium model.

It should be appreciated that device 900 provides a new approach for facilitating a qubit device comprising a vacuum encapsulated Josephson junction and/or a new approach for fabricating such a qubit device which is driven by relatively new quantum computing technologies. For example, device 900 provides a new approach for providing a Josephson junction in an encapsulated cavity comprising vacuum having no loss tangent, where such an encapsulated cavity further protects the Josephson junction from damage (e.g., physical damage that can occur during subsequent development and/or implementation of device 900).

Device 900 can be coupled to hardware and/or software to solve problems that are highly technical in nature, that are not abstract and that cannot be performed as a set of mental acts by a human. For example, device 900 can be implemented in a quantum computing device that can process information and/or execute calculations that are not abstract and that cannot be performed as a set of mental acts by a human.

It should be appreciated that device 900 can utilize various combinations of electrical components, mechanical components, and circuitry that cannot be replicated in the mind of a human or performed by a human. For example, facilitating quantum computing is an operation that is greater than the capability of a human mind. For instance, the amount of data processed, the speed of processing such data, and/or the types of data processed over a certain period of time by such a quantum computing device comprising and/or utilizing device 900 can be greater, faster, and/or different than the amount, speed, and/or data type that can be processed by a human mind over the same period of time.

Device 900 can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that device 900 can include information that is impossible to obtain manually by an entity, such as a human user. For example, the type, amount, and/or variety of information included in and/or processed by device 900 can be more complex than information obtained manually by a human user.

Figure 10:
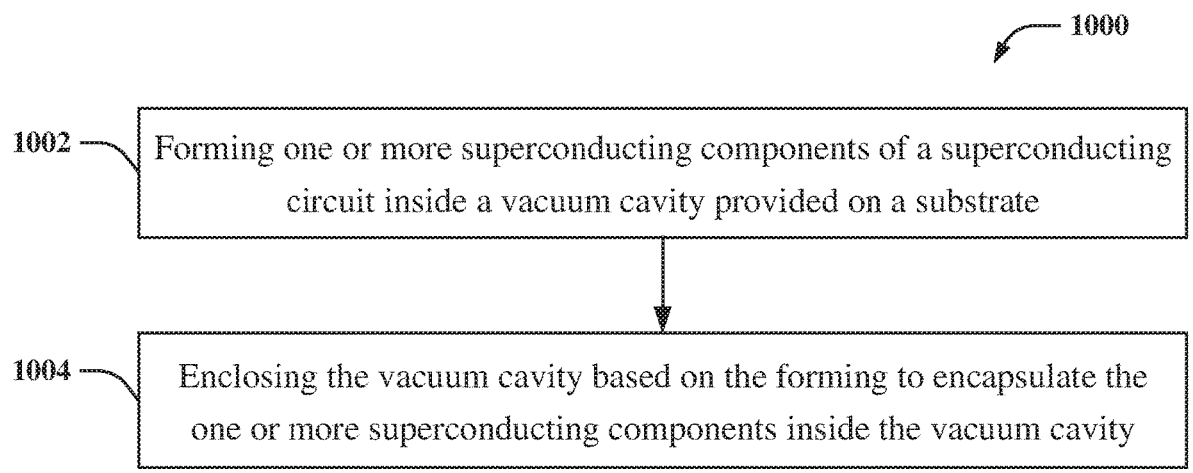
FIGS. 10 and 11 illustrate flow diagrams of example, non-limiting methods that can facilitate a qubit device comprising a vacuum encapsulated Josephson junction in accordance with one or more embodiments described herein.

FIG. 10 illustrates a flow diagram of an example, non-limiting method 1000 that can facilitate a qubit device comprising a vacuum encapsulated Josephson junction in accordance with one or more embodiments described herein. Repetitive description of like elements and/or processes employed in other embodiments described herein is omitted for sake of brevity.

At 1002, method 1000 can comprise forming (e.g., via computer 1212) one or more superconducting components (e.g., electrodes 206, first superconducting features 608, second superconducting features 708, Josephson junction 714, third superconducting features 808, etc.) of a superconducting circuit (e.g., a transmon qubit) inside a vacuum cavity (e.g., encapsulated vacuum cavity 810) provided on a substrate (e.g., substrate 104).

At 1004, method 1000 can comprise enclosing (e.g., via computer 1212) the vacuum cavity based on the forming to encapsulate the one or more superconducting components inside the vacuum cavity. For example, as described above with reference to FIGS. 6A-8C, based on forming such one or more superconducting components inside cavity 506, cavity 506 can then be enclosed by depositing third superconducting material 806 on second superconducting material 706 and/or cap layer 108 until cavity 506 is hermetically sealed to form encapsulated vacuum cavity 810 with vacuum and such one or more superconducting components encapsulated inside.

Figure 11:
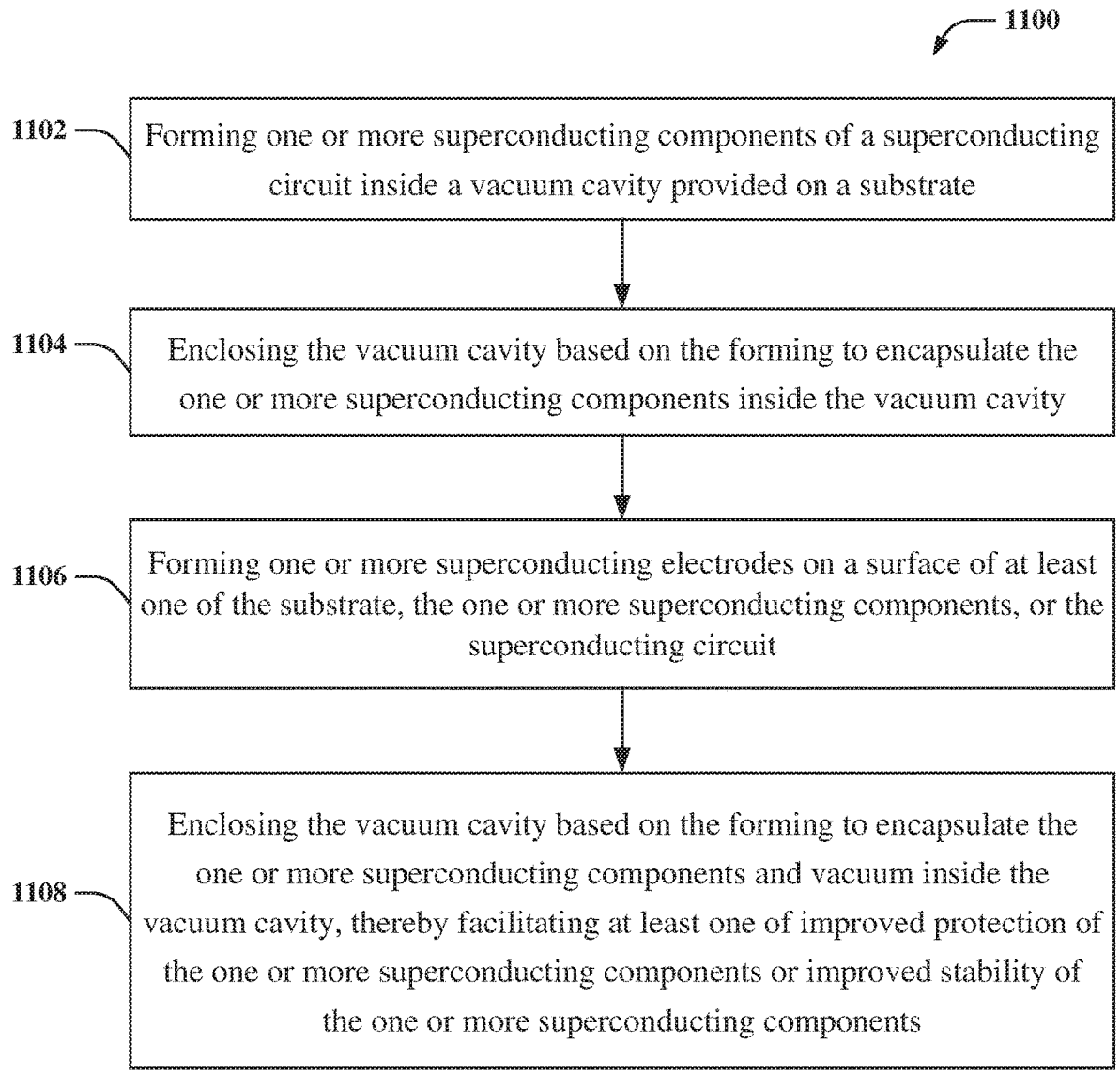

FIG. 11 illustrates a flow diagram of an example, non-limiting method 1100 that can facilitate a qubit device comprising a vacuum encapsulated Josephson junction in accordance with one or more embodiments described herein. Repetitive description of like elements and/or processes employed in other embodiments described herein is omitted for sake of brevity.

At 1102, method 1100 can comprise forming (e.g., via computer 1212) one or more superconducting components (e.g., electrodes 206, first superconducting features 608, second superconducting features 708, Josephson junction 714, third superconducting features 808, etc.) of a superconducting circuit (e.g., a transmon qubit) inside a vacuum cavity (e.g., encapsulated vacuum cavity 810) provided on a substrate (e.g., substrate 104).

At 1104, method 1100 can comprise enclosing (e.g., via computer 1212) the vacuum cavity based on the forming to encapsulate the one or more superconducting components inside the vacuum cavity. For example, as described above with reference to FIGS. 6A-8C, based on forming such one or more superconducting components inside cavity 506, cavity 506 can then be enclosed by depositing third superconducting material 806 on second superconducting material 706 and/or cap layer 108 until cavity 506 is hermetically sealed to form encapsulated vacuum cavity 810 with vacuum and such one or more superconducting components encapsulated inside.

At 1106, method 1100 can comprise forming (e.g., via computer 1212) one or more superconducting electrodes (e.g., electrodes 206) on a surface (e.g., top surface, side surface, etc.) of at least one of the substrate, the one or more superconducting components, or the superconducting circuit. For example, as described above with reference to FIGS. 2A and 2B, electrodes 206 can be formed on at least one surface (e.g., top surface, side surface, etc.) of substrate 104. In another example, electrodes 206 can be formed such that, in subsequent fabrication steps, one of first superconducting features 608 can be coupled to (e.g., formed on a surface of) one electrode 206 via galvanic contact 612 and one of second superconducting features 708 can be coupled to (e.g., formed on a surface of) another electrode 206 via galvanic contact 712 as described above with reference to FIGS. 6A, 6B, 6C, 7A, 7B, and 7C.

At 1108, method 1100 can comprise enclosing (e.g., via computer 1212) the vacuum cavity based on the forming to encapsulate the one or more superconducting components and vacuum inside the vacuum cavity, thereby facilitating at least one of improved protection of the one or more superconducting components or improved stability of the one or more superconducting components. For example, as described above with reference to FIGS. 6A-8C, based on forming such one or more superconducting components inside cavity 506, cavity 506 can then be enclosed by depositing third superconducting material 806 on second superconducting material 706 and/or cap layer 108 until cavity 506 is hermetically sealed to form encapsulated vacuum cavity 810 with vacuum and such one or more superconducting components encapsulated inside. In this example, encapsulated vacuum cavity 810 can thereby facilitate improved protection of and/or improved stability of the one or more superconducting components.

The example, non-limiting multi-step fabrication sequences described above with reference to FIGS. 1A-9B and/or the operations of methods 1000, 1100 described above, which can be implemented to fabricate one or more embodiments of the subject disclosure described herein and/or illustrated in the figures, can be implemented by a computing system (e.g., operating environment 1200 illustrated in FIG. 12 and described below) and/or a computing device (e.g., computer 1212 illustrated in FIG. 12 and described below). In non-limiting example embodiments, such computing system (e.g., operating environment 1200) and/or such computing device (e.g., computer 1212) can comprise one or more processors and one or more memory devices that can store executable instructions thereon that, when executed by the one or more processors, can facilitate performance of the example, non-limiting multi-step fabrication operations described herein with reference to FIGS. 1A-9B and/or the operations of methods 1000, 1100 described above with reference to FIGS. 10 and 11, respectively. As a non-limiting example, the one or more processors can facilitate performance of the example, non-limiting multi-step fabrication operations described herein with reference to FIGS. 1A-9B and/or the operations of methods 1000, 1100 described above by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 12:
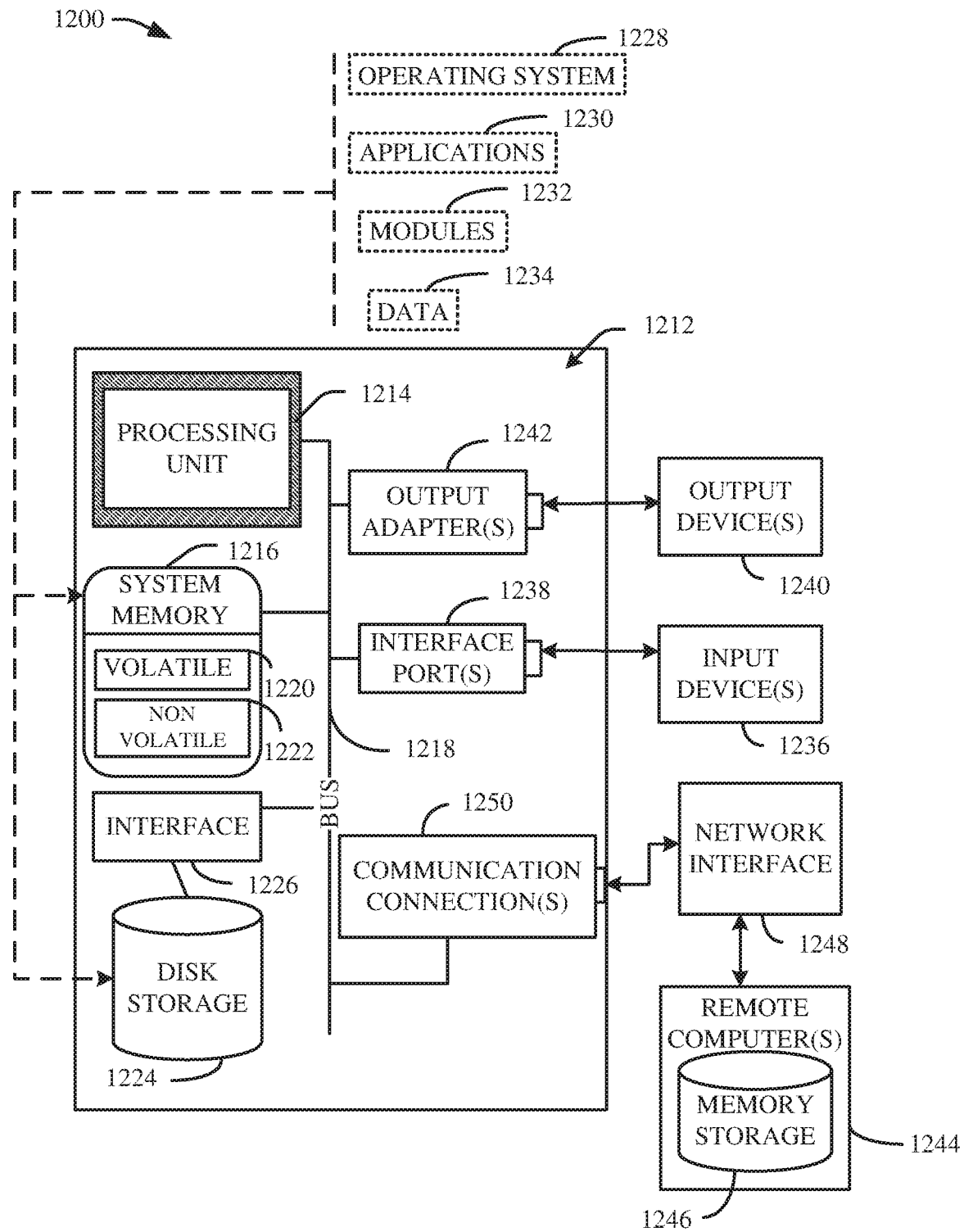
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. For example, operating environment 1200 can be used to implement the example, non-limiting multi-step fabrication operations described herein with reference to FIGS. 1A-9B and/or the operations of methods 1000, 1100 described above with reference to FIGS. 10 and 11, respectively, which can facilitate implementation of one or more embodiments of the subject disclosure described herein. Repetitive description of like elements and/or processes employed in other embodiments described herein is omitted for sake of brevity.

With reference to FIG. 12, a suitable operating environment 1200 for implementing various aspects of this disclosure can also include a computer 1212. The computer 1212 can also include a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1216 can also include volatile memory 1220 and nonvolatile memory 1222. The basic input/output system (BIOS), containing the basic routines to transfer information between elements within the computer 1212, such as during start-up, is stored in nonvolatile memory 1222. Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media. To facilitate connection of the disk storage 1224 to the system bus 1218, a removable or non-removable interface is typically used, such as interface 1226. FIG. 12 also depicts software that acts as an intermediary between users and the basic computer resources described in the suitable operating environment 1200. Such software can also include, for example, an operating system 1228. Operating system 1228, which can be stored on disk storage 1224, acts to control and allocate resources of the computer 1212.

System applications 1230 take advantage of the management of resources by operating system 1228 through program modules 1232 and program data 1234, e.g., stored either in system memory 1216 or on disk storage 1224. It is to be appreciated that this disclosure can be implemented with various operating systems or combinations of operating systems. A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port can be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a vacuum cavity located between a substrate and a capping layer, wherein the capping layer comprises an opening to the vacuum cavity;
   a first material layer located in a first direction of the opening;
   a second material layer located in a second direction of the opening; and
   one or more superconducting components of a superconducting circuit provided inside the vacuum cavity.

2. The device of claim 1, wherein the superconducting circuit comprises a qubit.

3. The device of claim 1, wherein the superconducting circuit comprises a transmon qubit and the one or more superconducting components comprise a Josephson junction.

4. The device of claim 1, wherein at least one element selected from the group consisting of: the substrate, the one or more superconducting components, and the superconducting circuit comprises one or more single crystal materials.

5. The device of claim 1, further comprising:
   one or more superconducting electrodes provided on a surface of at least one element selected from the group consisting of: the substrate and the one or more superconducting components.

6. A method, comprising:
   forming one or more superconducting components of a superconducting circuit inside a vacuum cavity provided on a substrate; and
   enclosing the vacuum cavity to encapsulate the one or more superconducting components inside the vacuum cavity, wherein enclosing the vacuum cavity comprises:
      depositing a first material in a first direction; and
      depositing a second material in a second direction.

7. The method of claim 6, wherein the superconducting circuit comprises a qubit.

8. The method of claim 6, wherein the superconducting circuit comprises a transmon qubit and the one or more superconducting components comprise a Josephson junction.

9. The method of claim 6, wherein the depositing comprises growing one or more crystalline materials using at least one epitaxial film growth process.

10. The method of claim 6, further comprising:
    forming one or more superconducting electrodes on a surface of at least one of the substrate, the one or more superconducting components, or the superconducting circuit.

11. A device, comprising:
    a vacuum cavity located between a substrate and a capping layer, wherein the capping layer comprises an opening to the vacuum cavity;
    a first material layer located in a first direction of the opening;
    a second material layer located in a second direction of the opening;
    a third material located between the first material layer and the second material layer in the opening; and
    one or more superconducting components comprising one or more epitaxial films provided inside the vacuum cavity.

12. The device of claim 11, wherein the one or more superconducting components comprise a Josephson junction.

13. The device of claim 11, wherein at least one element selected from the group consisting of: the substrate and the one or more superconducting components comprises one or more single crystal materials.

14. The device of claim 11, further comprising:
    one or more superconducting electrodes provided on a surface of at least one element selected from the group consisting of: the substrate and the one or more superconducting components.

15. The device of claim 1 further comprising a remaining portion of a removable layer located between the capping layer and the substrate.

16. The device of claim 15 wherein the remaining portion of the removable layer, the substrate, the capping layer, the first material layer, and the second material layer define the vacuum cavity.

17. The method of claim 6 further comprising depositing a third material layer in a third direction.

18. The method of claim 6, wherein a Josephson junction is formed during the depositing of the first material and the depositing of the second material.

19. The device of claim 11 further comprising a remaining portion of a removable layer located between the capping layer and the substrate.

20. The device of claim 15 wherein the remaining portion of the removable layer, the substrate, the capping layer, the first material layer, the second material layer, and the third material layer define the vacuum cavity.

* * * * *